US009052367B2

(12) United States Patent
Akita et al.

(10) Patent No.: US 9,052,367 B2
(45) Date of Patent: *Jun. 9, 2015

(54) MRI RF COIL CONTROL SIGNALS MODULATED ONTO THE RF COIL CLOCK SIGNAL

(75) Inventors: Koji Akita, Yokohama (JP); Takahiro Sekiguchi, Yokohama (JP); Kazuya Okamoto, Saitama (JP); Sojuro Kato, Nasushiobara (JP)

(73) Assignees: KABUSHIKI KAISHA TOSHIBA, Minato-Ku, Tokyo (JP); TOSHIBA MEDICAL SYSTEMS CORPORATION, Otawara-Shi, Tochigi (JP)

( * ) Notice: Subject to any disclaimer, the term of this patent is extended or adjusted under 35 U.S.C. 154(b) by 1148 days.

This patent is subject to a terminal disclaimer.

(21) Appl. No.: 12/939,372

(22) Filed: Nov. 4, 2010

(65) Prior Publication Data

US 2011/0109316 A1 May 12, 2011

(30) Foreign Application Priority Data

Nov. 6, 2009 (JP) .................................. 2009-255290

(51) Int. Cl.
*G01R 33/36* (2006.01)
(52) U.S. Cl.
CPC ........ *G01R 33/3607* (2013.01); *G01R 33/3621* (2013.01); *G01R 33/3692* (2013.01)
(58) Field of Classification Search
USPC .......................... 324/300–322; 382/128–133; 600/407–435; 327/292; 455/23; 310/317; 375/355, 371, 375, 376
See application file for complete search history.

(56) References Cited

U.S. PATENT DOCUMENTS 3,403,340 A * 9/1968 Becker et al. ................. 375/231
3,412,218 A * 11/1968 Comerci ......................... 360/22
(Continued)

FOREIGN PATENT DOCUMENTS

CN 1114809 A 1/1996
CN 1574629 A 2/2005
(Continued)

OTHER PUBLICATIONS

JP Office Action in JP 2009-255290 mailed Sep. 10, 2013 with English translation.
(Continued)

*Primary Examiner* — Melissa Koval
*Assistant Examiner* — Tiffany Fetzner
(74) *Attorney, Agent, or Firm* — Nixon & Vanderhye P.C.

(57) ABSTRACT

According to one embodiment, an apparatus includes a control unit and a coil unit. The control unit generates a first clock signal, generates a data signal to indicate an operating condition, modulates the first clock signal by the data signal to obtain a modulated signal, generates a clock transmission signal including the modulated signal, and emits the clock transmission signal. The coil unit converts the clock transmission signal into an electric signal, detects the modulated signal from the clock transmission signal, generates a second clock signal synchronous with the first clock signal from the modulated signal, detects an MR signal generated in a subject, digitizes, synchronously with the second clock signal, the MR signal, detects the data signal from the detected modulated signal by using of the second clock signal, controls the operating condition of the coil unit to be the operating condition indicated by the data signal.

26 Claims, 18 Drawing Sheets

(56) References Cited

U.S. PATENT DOCUMENTS

| | | | |
|---|---|---|---|
| 4,145,943 A * | 3/1979 | Luce | 84/708 |
| 4,228,717 A * | 10/1980 | Luce | 84/708 |
| 5,155,595 A * | 10/1992 | Robison | 348/500 |
| 5,610,954 A * | 3/1997 | Miyashita et al. | 375/375 |
| 5,889,828 A | 3/1999 | Miyashita et al. | 375/375 |
| 5,923,628 A | 7/1999 | Nogawa | 369/50 |
| 5,929,683 A * | 7/1999 | Menkhoff | 327/292 |
| 7,043,202 B2 * | 5/2006 | Ozawa et al. | 455/23 |
| 7,292,670 B2 | 11/2007 | Gupta et al. | 375/371 |
| 7,336,754 B2 * | 2/2008 | Aoyama | 375/376 |
| 7,368,850 B2 * | 5/2008 | Takeuchi | 310/317 |
| 8,149,974 B2 * | 4/2012 | Arima et al. | 375/355 |
| 8,174,264 B2 * | 5/2012 | Adachi et al. | 324/318 |
| 8,374,075 B2 * | 2/2013 | Bogdan | 370/210 |
| 8,402,300 B2 * | 3/2013 | Baumgartl et al. | 713/400 |
| 8,502,540 B2 * | 8/2013 | Nakanishi et al. | 324/322 |
| 2004/0252804 A1 | 12/2004 | Aoyama | 375/376 |
| 2005/0031065 A1* | 2/2005 | Gupta et al. | 375/371 |
| 2006/0025094 A1* | 2/2006 | Ozawa et al. | 455/208 |
| 2006/0071723 A1 | 4/2006 | Takeuchi | 331/65 |
| 2006/0087346 A1 | 4/2006 | Ishida et al. | 327/3 |
| 2009/0041104 A1* | 2/2009 | Bogdan | 375/226 |
| 2009/0322335 A1* | 12/2009 | Adachi et al. | 324/318 |
| 2010/0002822 A1 | 1/2010 | Arima et al. | 375/371 |
| 2010/0117649 A1* | 5/2010 | Nakanishi et al. | 324/318 |
| 2010/0259261 A1* | 10/2010 | Saes et al. | 324/309 |
| 2011/0040997 A1* | 2/2011 | Baumgartl et al. | 713/401 |
| 2011/0109316 A1* | 5/2011 | Akita et al. | 324/322 |

FOREIGN PATENT DOCUMENTS

| | | |
|---|---|---|
| CN | 1735977 A | 2/2006 |
| CN | 101501995 A | 8/2009 |
| JP | 5-261085 | 10/1993 |
| JP | 6-86769 | 3/1994 |
| JP | 2001-76439 | 3/2001 |
| JP | 2008-518652 | 6/2008 |
| JP | 2008-522651 | 7/2008 |
| JP | 2010-29644 | 2/2010 |

OTHER PUBLICATIONS

CN Office Action in CN 201210289701.2 mailed May 6, 2014 with English translation.

J. Zhenqing, "Numerical Phase Comparator," Communication Equipment, Apr. 15, 1980, pp. 67-77.

Boerner C. et al., "160 Gbit/s clock recovery with electro-optical PLL using a bidirectionally operated electroabsorption modulator as phase comparator," Optical Fiber Communications Conference, 2003. OFC 2003, vol. 2, pp. 670-671.

Office Action in JP 2013-233542 mailed Sep. 30, 2014 with English translation.

* cited by examiner

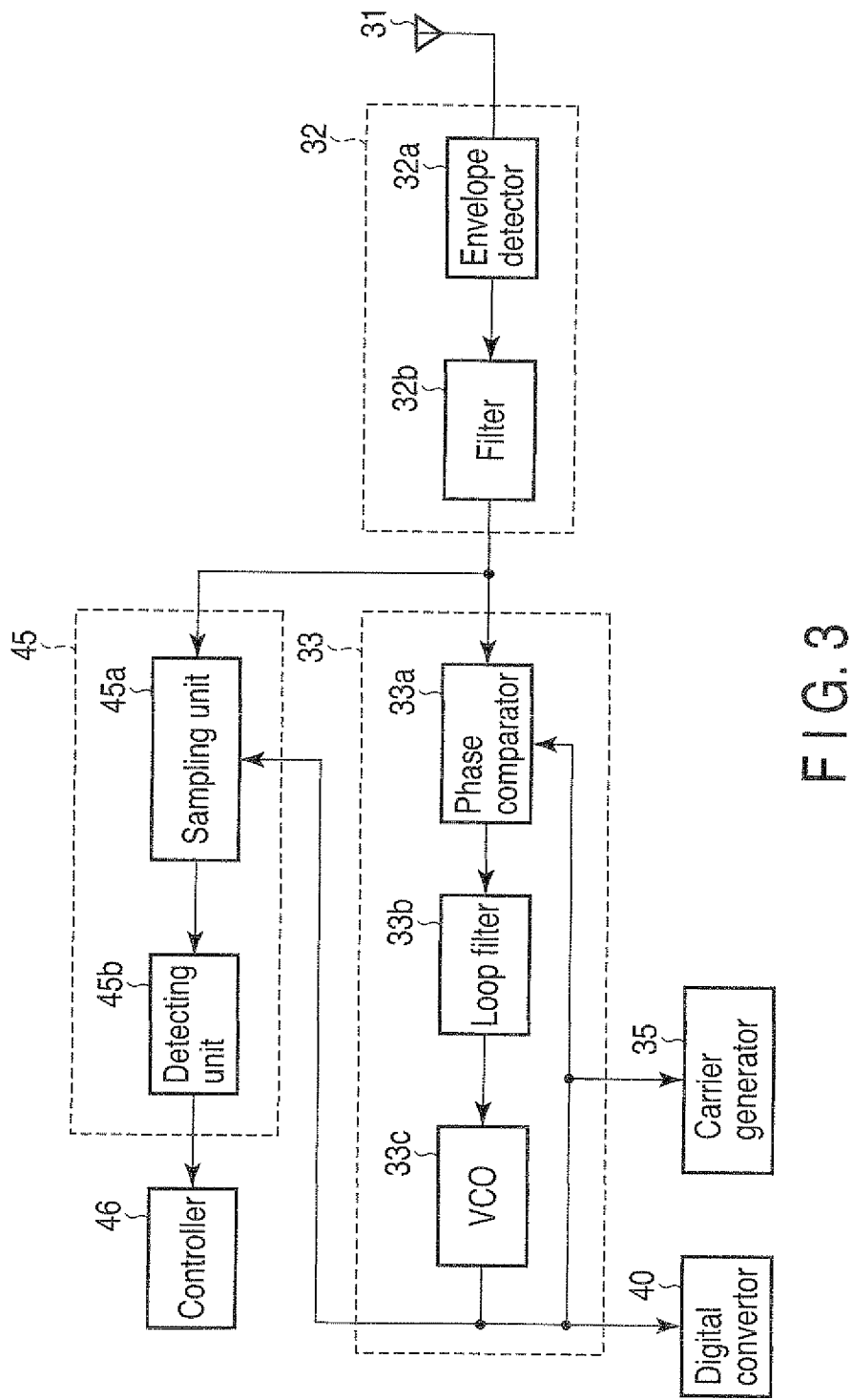
F I G. 3

MRI RF COIL CONTROL SIGNALS MODULATED ONTO THE RF COIL CLOCK SIGNAL

CROSS-REFERENCE TO RELATED APPLICATIONS

This application is based upon and claims the benefit of priority from Japanese Patent Application No. 2009-255290, filed Nov. 6, 2009; the entire contents of which are incorporated herein by reference.

FIELD

Embodiments described herein relate generally to a magnetic resonance imaging apparatus, a phase comparator, a control unit and a coil unit.

BACKGROUND

Generally, in a magnetic resonance imaging apparatus, a great number of coil units are connectable to a control unit due to increased channels of a collection system. Accordingly, the number of connecting cables between the coil units and the control unit is inconveniently increased. It is therefore desired to wirelessly transmit signals between the coil units and the control unit.

Under these circumstances, there has already been suggested a technique that enables wireless signal transmission between a coil unit and a control unit (e.g., see Jpn. Pat. Appln. KOKAI Publication No. 05-261085). A related technique is also disclosed in Jpn. Pat. Appln. KOKAI Publication No. 2001-76439.

Recent coil units have an increasing number of functions, and the operating condition of the coil unit has to be controllable from the control unit. If a control signal used for this purpose is also wirelessly transmitted, there is a further increase of radio channels.

In the meantime, the present applicant has suggested, as Jpn. Pat. Appln. No. 2009-122247 (Jpn. Pat. Appln. KOKAI Publication No. 2010-29644), a technique that uses a digital wireless method for the signal transmission between a coil unit and a control unit (main unit). According to this technique suggested in Jpn. Pat. Appln. No. 2009-122247, radio channels for respectively transmitting a sampling clock and a carrier wave are required.

Thus, disadvantageously, a great number of radio channels are needed for the signal transmission between the coil units and the control unit, and the scale of a circuit for sending/receiving radio signals is increased.

Consequently, there has been a desire to reduce the number of radio channels so that the scale of the circuit for sending/receiving radio signals can be reduced.

BRIEF DESCRIPTION OF THE DRAWINGS

FIG. 3 is a block diagram of a wave detector, a clock reproducer and a data detector in FIG. 2;

DETAILED DESCRIPTION

In general according to the one embodiment, a magnetic resonance imaging apparatus including a control unit, and a coil unit separate from the control unit. The control unit including a clock generator, a data generator, a modulator, a transmission signal generator and a transmitting antenna. The clock generator generates a first clock signal. The data generator generates a data signal to indicate an operating condition of the coil unit. The modulator modulates the first clock signal by the data signal to obtain a modulated signal. The transmission signal generator generates a clock transmission signal including the modulated signal. The transmitting antenna emits the clock transmission signal to space. The coil unit includes a receiving antenna, a wave detector, a clock reproducer, a coil, a digital convertor, a data detector and a controller. The receiving antenna converts the clock transmission signal propagated through the space into an electric signal. The wave detector detects the modulated signal from the clock transmission signal converted into the electric signal by the receiving antenna. The clock reproducer generates a second clock signal synchronous with the first clock signal from the modulated signal detected by the wave detector. The coil detects a magnetic resonance signal generated in a subject. The digital convertor digitizes, synchronously with the second clock signal, the magnetic resonance signal detected by the coil. The data detector detects the data signal from the detected modulated signal by using of the second clock signal. The controller controls the operating condition of the coil unit to be the operating condition indicated by the data signal detected by the data detector.

Embodiments will be described hereinafter with reference to the drawings.

Figure 1:
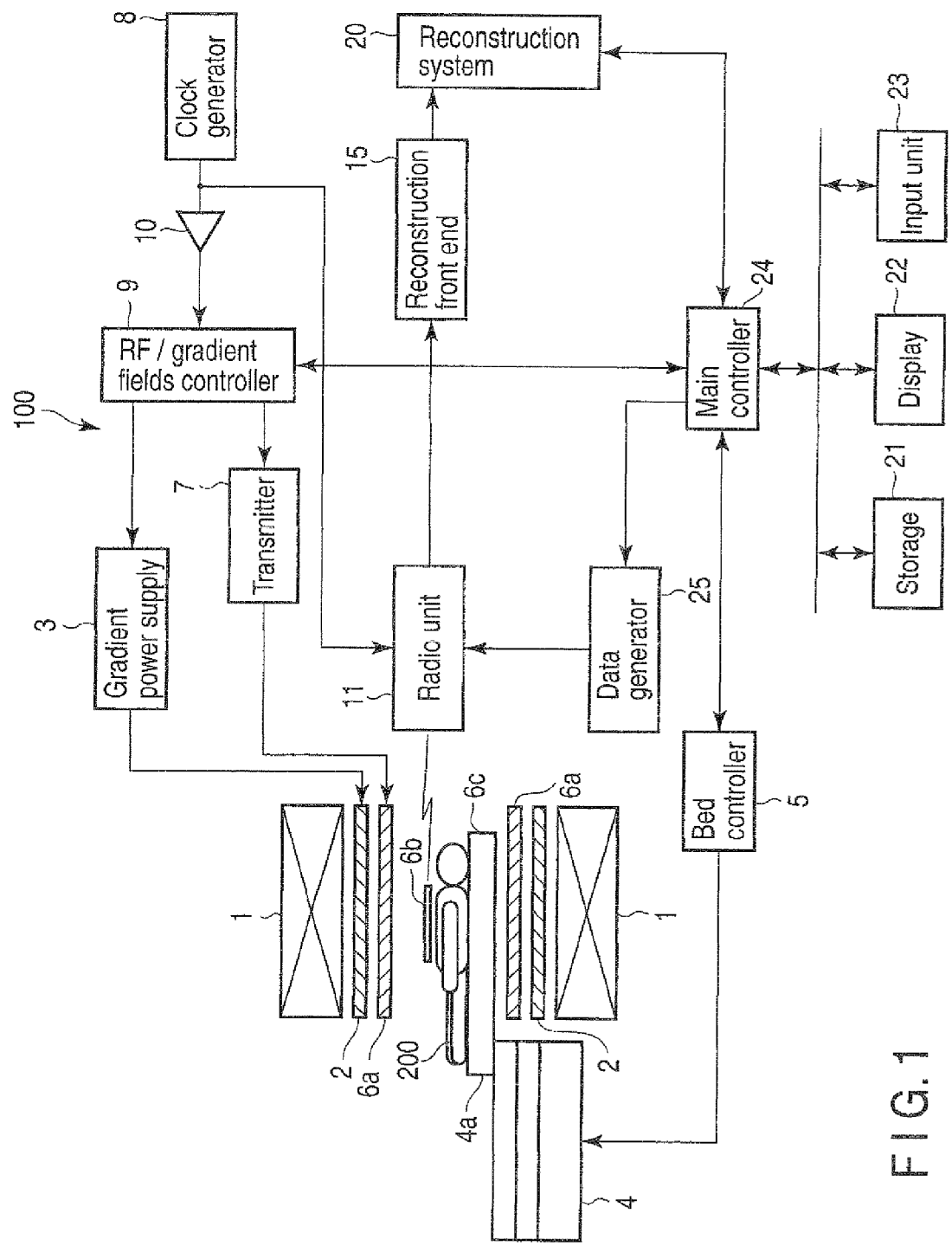
FIG. 1 is a diagram showing the configuration of a magnetic resonance imaging apparatus (MRI apparatus) according to embodiments.

FIG. 1 is a diagram showing the configuration of a magnetic resonance imaging apparatus (MRI apparatus) 100 according to the embodiments. The MRI apparatus 100 comprises a static magnet 1, a gradient coil 2, a gradient power supply 3, a bed 4, a bed controller 5, coil units 6a and 6b, a transmitter 7, a clock generator 8, an RF/gradient fields controller 9, a driver 10, a radio unit 11, a reconstruction front end 15, a reconstruction system 20, a storage 21, a display 22, an input unit 23, a main controller 24 and a data generator 25. Among these components, the components other than the coil unit 6b are included in a main unit separate from the coil unit 6b. Moreover, the main unit may be divided into a gantry and a processor. In this case, for example, the static magnet 1, the gradient coil 2, the gradient power supply 3, the bed 4, the bed controller 5, the coil unit 6a, the transmitter 7, the RE/gradient fields controller 9 and the radio unit 11 are provided in the gantry, while the clock generator 8, the driver 10, the reconstruction front end 15, the reconstruction system. 20, the storage 21, the display 22, the input unit 23 and the main controller 24 are provided in the processor. Thus, the main unit or the processor functions as a control unit.

The static magnet 1 has a hollow cylindrical shape, and generates a uniform static magnetic field in its internal space. For example, a permanent magnet or superconducting magnet is used as the static magnet 1.

The gradient coil 2 has a hollow cylindrical shape, and is disposed inside the static magnet 1. The gradient coil 2 has a combination of three kinds of coils corresponding to X, Y, Z axes perpendicular one another. The gradient coil 2 generates a gradient magnetic field having its intensity inclined along the X, Y, Z axes when the three kinds of coils are separately supplied with currents from the gradient power supply 3. In addition, the Z axis is in the same direction as, for example, the direction of the static magnetic field. The gradient magnetic fields of the X, Y, Z axes correspond to, for example, a slice selecting gradient magnetic field Gs, a phase encoding gradient magnetic field Ge and a read-out gradient magnetic field Gr, respectively. The slice selecting gradient magnetic field Gs is used to determine a given imaging section. The phase encoding gradient magnetic field Ge is used to change the phase of a magnetic resonance signal in accordance with a spatial position. The read-out gradient magnetic field Gr is used to change the frequency of the magnetic resonance signal in accordance with the spatial position.

A subject 200 is inserted into an internal space (imaging space) of the gradient coil 2 while being mounted on a top board 4a of the bed 4. The bed 4 moves the top board 4a in its longitudinal direction (right-and-left direction in FIG. 1) and vertical direction under the control of the bed controller 5. Normally, the bed 4 is installed so that this longitudinal direction is parallel with the central axis of the static field magnet 1.

The coil unit 6a includes one coil or a plurality of coils contained in a cylindrical case. The coil unit 6a is disposed inside the gradient magnetic field coil 2. The coil unit 6a is supplied with a high-frequency pulse (RF pulse) from the transmitter 7 to generate a high-frequency magnetic field.

The coil unit 6b is mounted on the top board 4a, embedded in the top board 4a, or attached to the subject 200. At the time of imaging, the coil unit 6b is inserted into the imaging space together with the subject 200, and receives the magnetic resonance signal emitted from the subject 200 as electromagnetic waves to obtain an electric magnetic resonance signal. Various types of coil units are attachable as the coil unit 6b. Moreover, two or more receiving coil units may be attached. The coil unit 6b has a function of digitally and wirelessly transmitting the magnetic resonance signal obtained as an electric signal.

The transmitter 7 supplies the coil unit 6a with the RF pulse corresponding to a Larmor frequency.

The clock generator 8 generates a first clock signal having a predetermined frequency. This first clock signal may be used as a system clock serving as a reference for the timing of the overall operation of the MRI apparatus 100.

The RF/gradient fields controller 9 changes the gradient magnetic fields in accordance with a required pulse sequence under the control of the main controller 24, and controls the gradient power supply 3 and the transmitter 7 so that the RE pulse may be transmitted. In addition, the RE/gradient fields controller 9 is provided with the first clock signal after the level of this signal has been properly adjusted by the driver 10. The RE/gradient fields controller 9 carries out the pulse sequence synchronously with this first clock signal.

The radio unit 11 receives the magnetic resonance signal digitally and wirelessly transmitted from the coil unit 6b. The radio unit 11 digitally demodulates the received digital magnetic resonance signal, and then outputs the demodulated signal to the reconstruction front end 15. The radio unit 11 wirelessly transmits the first clock signal and a modulation/demodulation clock signal to the coil unit 6b. Moreover, the radio unit 11 modulates the first clock signal by a data signal output by the data generator 25, and thereby wirelessly transmits the data signal together with the first clock signal.

The reconstruction front end 15 subjects the magnetic resonance signal provided from the radio unit 11 to gain control, frequency conversion and quadrature detection. The reconstruction front end 15 further uncompresses the amplitude of the magnetic resonance signal compressed in the coil unit 6b.

The reconstruction system 20 reconstructs an image of the subject 200 on the basis of at least one of the magnetic resonance signals processed in the reconstruction front end 15.

The storage 21 stores various kinds of data such as image data indicating the image reconstructed in the reconstruction system 20.

The display 22 displays the image reconstructed in the reconstruction system 20 or various kinds of information including various kinds of operation screens for a user to operate the MRI apparatus 100, under the control of the main controller 24. A display device such as a liquid crystal display can be used as the display 22.

The input unit 23 accepts various commands and information inputs from the operator. A pointing device such as a mouse or a track ball, a selecting device such as a mode changeover switch, or an input device such as a keyboard can be suitably used as the input unit 23.

The main controller 24 has a CPU, a memory, etc. that are not shown, and controls the whole MRI apparatus 100.

The data generator 25 generates the data signal for indicating the operating condition of the coil unit 6b, under the control of the main controller 24.

Figure 2:
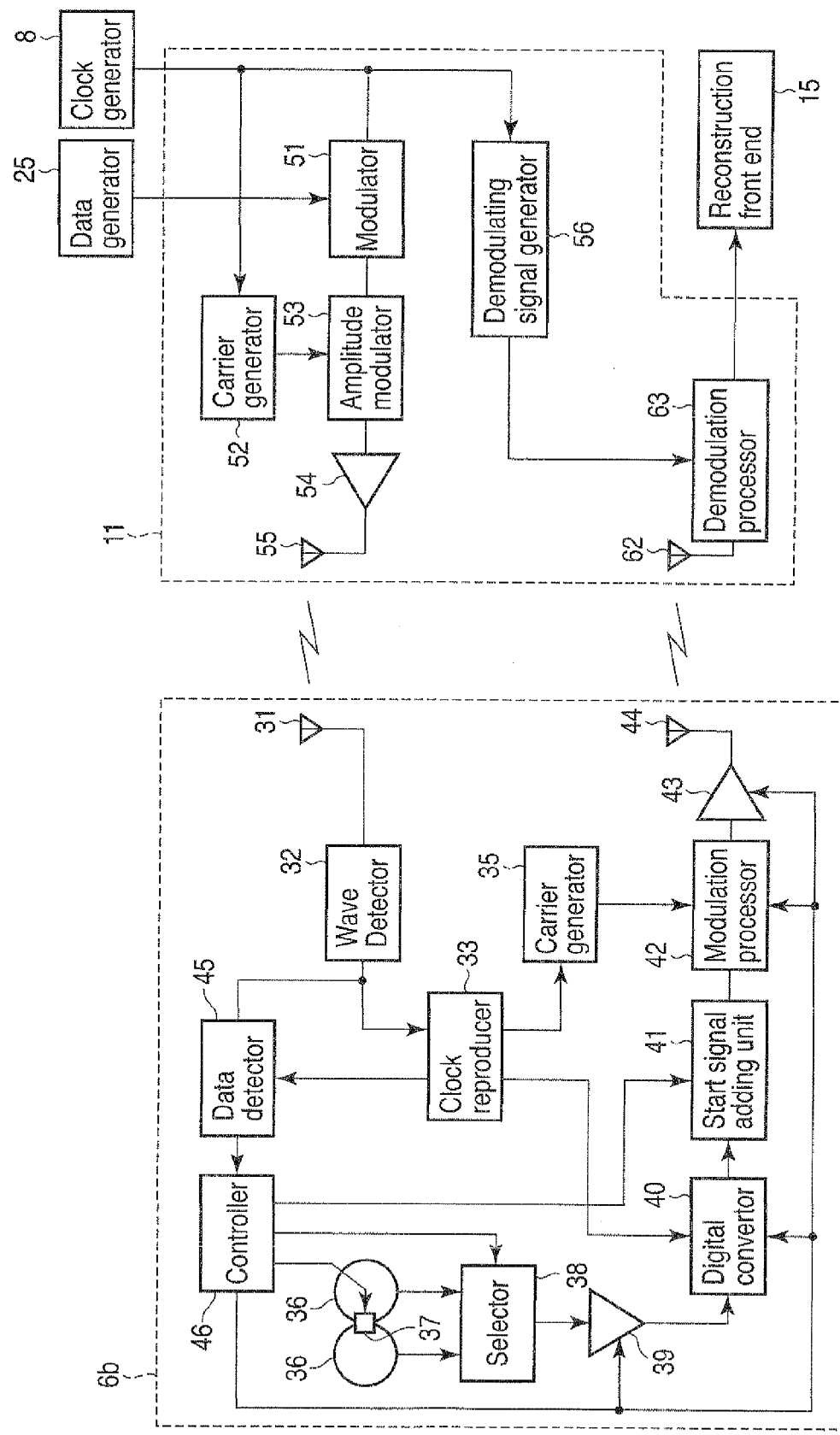
FIG. 2 is a block diagram of a coil unit and a radio unit in FIG. 1.

FIG. 2 is a block diagram of the coil unit 6b and the radio unit 11 in FIG. 1.

The coil unit 6b includes a receiving antenna 31, a wave detector 32, a clock reproducer 33, a carrier generator 35, a plurality of coils 36, a coupling circuit 37, a selector 38, a LOG amplifier 39, a digital convertor 40, a signal adding unit 41, a modulation processor 42, a driver 43, a transmitting antenna 44, a data detector 45 and a controller 46. Moreover, the radio unit 11 includes a modulator 51, a carrier generator 52, an amplitude modulator 53, a driver 54, a transmitting antenna 55, a demodulating signal generator 56 and a demodulation processor 63.

The modulator 51 modulates the first clock signal output from the clock generator 8 by the data signal output from the data generator 25, and thereby generates a modulated signal.

The carrier generator 52 generates a carrier signal having a predetermined frequency for wirelessly transmitting the modulated signal. The frequency of the carrier signal is set to such a value that avoids a frequency equal to a fraction of an integer of a magnetic resonance frequency.

The amplitude modulator 53 modulates the amplitude of the carrier signal by the modulated signal, and thus generates a clock transmission signal.

The driver 54 adjusts the clock transmission signal to a level suitable for wireless transmission.

Thus, the carrier generator 52, the amplitude modulator 53, the driver 54 and the transmitting antenna 55 constitute a transmission signal generator for generating the clock transmission signal including the modulated signal.

When the electric clock transmission signal output from the driver 54 is supplied to the transmitting antenna 55, the transmitting antenna 55 emits this signal as electromagnetic waves.

In response to the electromagnetic waves including the emission from the transmitting antenna 55, the receiving antenna 31 outputs a corresponding electric signal.

The wave detector 32 detects the modulated signal from the clock transmission signal included in the electric signal output from the transmitting antenna 55.

The clock reproducer 33 generates a second clock signal synchronous with a component of the first clock signal included in the modulated signal detected by the wave detector 32.

The demodulating signal generator 56 generates a demodulating signal having a predetermined frequency.

The carrier generator 35 uses the second clock signal reproduced in the clock reproducer 33 to generate a carrier wave. The frequency of the carrier wave is set to avoid a frequency equal to a fraction of an integer of the magnetic resonance frequency and to be different from the frequency of the carrier signal. Further, the carrier generator 35 properly adjusts the level of the reproduced carrier wave and then supplies the carrier wave to the modulation processor 42.

Although two coils 36 are only shown in FIG. 2, three or more coils may be provided in the coil unit 6b. These coils 36 form a phased array coil (PAC). In response to the magnetic resonance signal emitted from the subject 200 as electromagnetic waves, each of the coils 36 outputs a corresponding electric magnetic resonance signal.

The coupling circuit 37 couples/decouples two of the coils 36. The coupling circuit 37 comprises, for example, a PIN diode for coupling/decoupling. When three or more coils 36 are provided, two or more coupling circuits 37 may be provided for each of different combinations of the coils 36.

The selector 38 selects one of the coils 36 under the control of the controller 46, and thereby validates the selected coil 36. The selector 38 inputs, to the LOG amplifier 39, the magnetic resonance signal output by the selected coil 36. The selector 38 may be able to simultaneously select all or at least two of the coils 36. For example, if the coils 36 are divided into several sections so that at least two coils 36 belong to each section, the selector 38 simultaneously selects at least two coils 36 belonging to the same section.

The LOG amplifier 39 compresses the amplitude of the magnetic resonance signal input from the selector 38 in accordance with a predetermined logarithmic function.

The digital convertor 40 digitizes the analog magnetic resonance signal output from the LOG amplifier 39. The digital convertor 40 samples the magnetic resonance signal for the digitization synchronously with the second clock signal supplied from the clock reproducer 33.

The signal adding unit 41 adds a start signal indicating the start timing of an echo signal to the magnetic resonance signal after digitized by the digital convertor 40, under the control of the controller 46.

The modulation processor 42 encodes, for digital transmission, the magnetic resonance signal after the addition of the start signal thereto. For example, a convolution code, Reed-Solomon code, turbo code or LDCP code can be applied to the above encoding. The modulation processor 42 uses the encoded magnetic resonance signal to modulate the carrier wave supplied from the carrier generator 35, and thereby obtains a transmission signal.

The driver 43 adjusts the transmission signal output from the modulation processor 42 to a level suitable for wireless transmission, and then supplies the transmission signal to the transmitting antenna 44.

Thus, the carrier generator 35, the modulation processor 42 and the driver 43 constitute a resonance signal transmitter.

The transmitting antenna 44 emits, to space, the electric transmission signal supplied from the driver 43 as electromagnetic waves.

In response to the electromagnetic waves including the emission from the transmitting antenna 44, an antenna 62 outputs a corresponding electric signal.

The demodulation processor 63 uses the carrier wave supplied from the demodulating signal generator 56 to demodulate the electric signal output from the antenna 62 to a digital magnetic resonance signal.

FIG. 3 is a block diagram of the wave detector 32, the clock reproducer 33 and data detector 45.

The wave detector 32 includes an envelope detector 32a and a filter 32b.

The envelope detector 32a performs an envelope detection for the clock transmission signal included in the electric signal output from the transmitting antenna 55, and thus extracts a signal component corresponding to the modulated signal.

The filter 32b suppresses signals outside a desired band by band limitation out of the signal component extracted by the envelope detection, and thereby extracts the modulated signal.

The clock reproducer 33 includes a phase comparator 33a, a loop filter 33b and an oscillator (hereinafter referred to as a VCO) 33c.

The phase comparator 33a compares the modulated signal provided from the wave detector 32 with the phase of the second clock signal output by the VCO 33c, and then outputs a clock phase difference signal.

The loop filter 33b limits the band of the clock phase difference signal to generate a control voltage for the VCO 33c.

The VCO 33c oscillates the second clock signal. The VCO 33c changes the oscillation frequency in accordance with the voltage of the control signal provided from the loop filter 33b.

The data detector 45 includes a sampling unit 45a and a detector 45b.

The sampling unit 45a samples the modulated signal provided from the wave detector 32 synchronously with the second clock signal supplied from the clock reproducer 33.

The detector 45b compares a code string obtained in the sampling unit 45a with a data pattern predetermined as a data signal, and thereby detects the data signal.

On the basis of the data signal detected by the data detector 45, the controller 46 controls the operating conditions of the coupling circuit 37, the selector 38, the LOG amplifier 39, the digital convertor 40, the signal adding unit 41, the modulation processor 42 and the driver 43 as described later.

Now, the operation of the MRT apparatus 100 having the configuration described above is described. However, operations similar to that of an existing MRI apparatus are not described, for example, an operation of generating an echo signal in the subject 200, collecting the echo signal and reconstructing an image of the subject 200 on the basis of the collected echo signal. The characteristic operation of the MRI apparatus 100 is mainly described.

The coil unit 6b can change the operating condition regarding, for example, the following points:

(1) Selection of the coils 36 in the selector 38.
(2) Selection of a coupling mode/decoupling mode.
(3) Addition of the start signal to the magnetic resonance signal.
(4) Whether to transmit the magnetic resonance signal.

The operating condition is determined by the main controller 24.

If there is a need to change the operating condition in the coil unit 6b, the main controller 24 instructs the data generator 25 to generate a data signal for indicating such a change of the operating condition. In response to this instruction, the data generator 25 generates the data signal specified by the main controller 24. The data signal is represented by a string in which "0"s or "1"s are arranged. The pattern of the string varies depending on the contents of the instruction. Different corresponding data patterns are previously assigned to the respective points of the operating conditions mentioned above. The data generator 25 then generates a data signal of a string having a data pattern corresponding to the point indicated by the main controller 24.

The data signal generated by the data generator 25 is provided to the modulator 51. When the data signal is thus provided, the modulator 51 uses the data signal to modulate the first clock signal provided from the clock generator 8 and thus obtains a modulated signal. For this modulation, ON-OFF-keying (OOK) or amplitude-shift-keying (ASK), for example, can be used.

Figure 4:
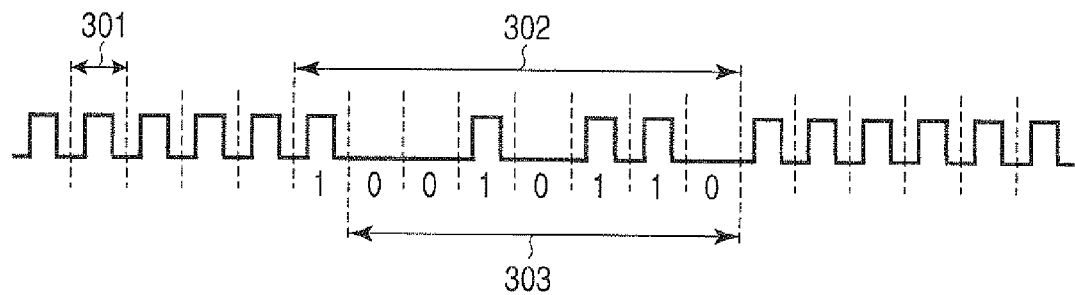
FIG. 4 is a diagram showing one example of a modulated signal.
Figure 5:
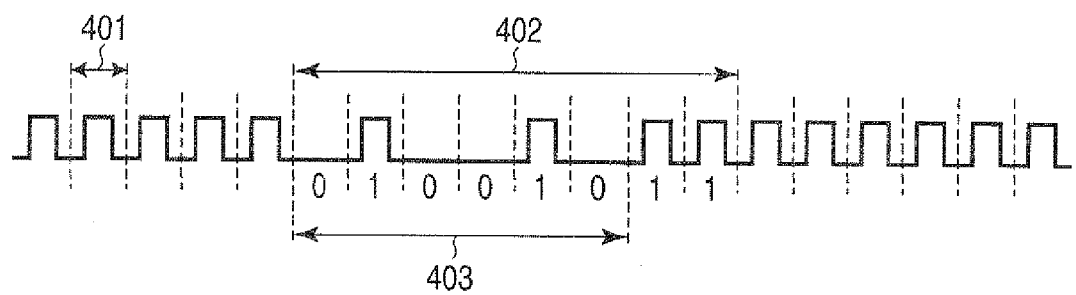
FIG. 5 is a diagram showing one example of a modulated signal.
Figure 6:
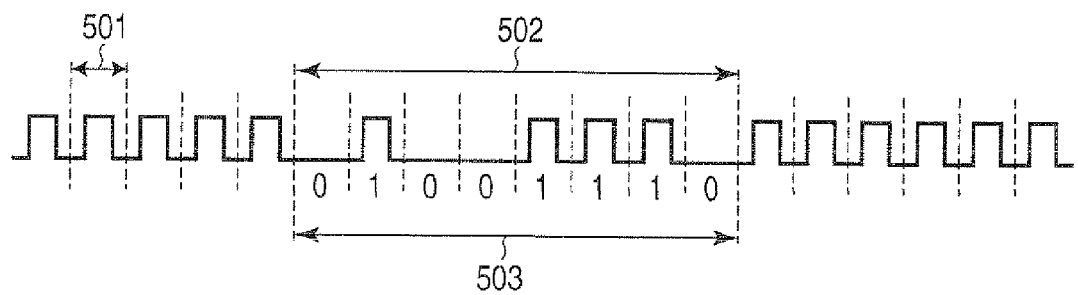
FIG. 6 is a diagram showing one example of a modulated signal.

FIGS. 4, 5 and 6 show examples of modulated signals, respectively.

In FIGS. 4, 5 and 6, sections 301, 401 and 501 indicates the period of the first clock signal. In the examples of FIGS. 4, 5 and 6, amplitude is changed by the unit of the period of the first clock signal to multiplex the data signal. For example, "1" is set when the amplitude of the first clock signal remains unchanged, and "0" is set when the amplitude is reduced. Thus, in sections 302, 402 and 502, data signals having strings "10010110", "01001011" and "01001110" are multiplexed, respectively.

The modulated signal thus obtained in the modulator 51 is used by the amplitude modulator 53 to modulate the amplitude of the carrier signal generated in the carrier generator 52. The clock transmission signal obtained by the amplitude modulator 53 is supplied to the transmitting antenna 55 via the driver 54, and then emitted as a radio wave to space from the transmitting antenna 55. When the radio wave propagates through the space and reaches the receiving antenna 31, the clock transmission signal is restored to an electric signal by the receiving antenna 31. The clock transmission signal is then detected by the wave detector 32 so that the modulated signal is extracted from the clock transmission signal. The modulated signal is provided to the clock reproducer 33 and the data detector 45.

The clock reproducer 33 generates the second clock signal synchronous with the modulated signal and thereby performs pseudo reproduction of the first clock signal included in the modulated signal. The data, detector 45 samples the modulated signal synchronously with the second clock signal generated by the clock reproducer 33, and compares the code string obtained by sampling with the predetermined data pattern to detect the data signal. The data signal or a command associated with an instruction indicated by the data signal is provided to the controller 46 from the data detector 45.

Thus, some instruction on a change of the operating condition in the coil unit 6b is wirelessly sent to the controller 46 of the coil unit 6b so that this instruction is superposed on the first clock signal.

In accordance with the instruction thus given, the controller 46 changes the operating condition regarding the above-mentioned respective points in the following manner.

(1) If there is an instruction to change the coil 36 to be validated among the coils 36, the controller 46 controls the selector 38 to newly select a coil 36 to be validated.

(2) If instructed to set the coupling mode, the controller 46 sets the coupling circuit 37 to a coupling state. If instructed to set the decoupling mode, the controller 46 sets the coupling circuit 37 to a decoupling state.

(3) If instructed to add the start signal to the magnetic resonance signal, the controller 46 controls the signal adding unit 41 to add the start signal to the magnetic resonance signal.

(4) If instructed to send the magnetic resonance signal, the controller 46 activates the LOG amplifier 39, the digital convertor 40, the modulation processor 42 and the driver 43. If instructed not to send the magnetic resonance signal, the controller 46 deactivates the LOG amplifier 39, the digital convertor 40, the modulation processor 42 and the driver 43.

Figure 7:
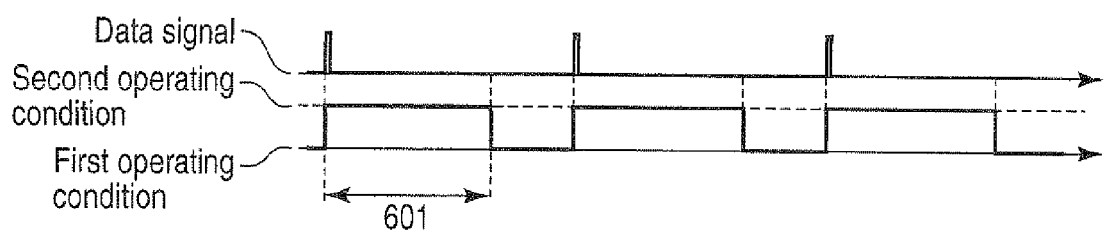
FIG. 7 is a timing chart of a data signal and changes of operating conditions.
Figure 8:
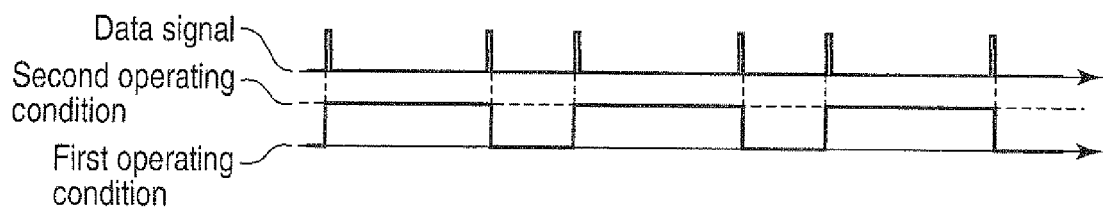
FIG. 8 is a timing chart of the data signal and changes of operating conditions.

In this embodiment, the data signal is treated as a trigger signal. That is, the main controller 24 causes the data generator 25 to generate the data signal in accordance with the timing of the necessity of a change in the operating condition of the coil unit 6b. The controller 46 then changes the operating condition in response to the detection of the data signal by the data detector 45. However, as shown in FIG. 7, the timing of changing from the first operating condition to the second operating condition may be only indicated by the data signal, and the operating condition may be changed to the first operating condition independently of the instruction by the data signal after continuation of the second operating condition for a predetermined period. Alternatively, as shown in FIG. 8, both the timing of changing from the first operating condition to the second operating condition and the timing of changing from the second operating condition to the first operating condition may be indicated by the data signal. In the latter case, the data pattern of the data signal may vary between the timing of changing from the first operating condition to the second operating condition and timing of changing from the second operating condition to the first operating condition.

The form shown in FIG. 8 is generally suitable for the change of the operating condition of (1). For the change of the operating condition of (2), one of the forms shown in FIG. 7 and FIG. 8 is suitable depending on a change sequence of the decoupling mode. That is, the form shown in FIG. 7 is suitable if a change sequence is used whereby one mode is set in a given period alone and the other mode is set in other periods. Otherwise, the form shown in FIG. 8 is suitable if a change sequence is used whereby the period in which both modes are set can be changed. Regarding the change of the operating condition of (3), the signal adding unit 41 should stop processing when the signal adding unit 41 has finished the addition of a predetermined start signal to the magnetic resonance signal, so that the form shown in FIG. 7 is generally suitable. Regarding the change of the operating condition of (4), one of the forms shown in FIG. 7 and FIG. 8 is suitable depending on the purpose of preventing the transmission of the magnetic resonance signal. The purpose of preventing the transmission of the magnetic resonance signal can be to avoid interference during the generation of a high-frequency magnetic field from the coil unit 6a (during the transmission of a 90-degree pulse or during the transmission of a 180-degree pulse). As far as this purpose is concerned, the form shown in FIG. 7 can be used if the period of generating the high-frequency magnetic field is fixed. However, the form shown in FIG. 8 should be used if the period of generating the high-frequency magnetic field varies. Moreover, in a period in which a series of operations for imaging is not performed, the operating condition that prevents the transmission of the magnetic resonance signal can be set to hold down battery consumption due to the operations of the LOG amplifier 39, the digital convertor 40, the modulation processor 42 and the driver 43.

Thus, according to this embodiment, the operating condition in the coil unit 6b can be controlled from the main unit. However, there is no need to ensure a radio channel to transmit the data signal because the data signal for controlling the operating condition is transmitted in such a manner as to be superposed on the clock signal. As a result, it is possible to reduce the number of radio channels for information transmission between the coil unit 6b and the main unit and thereby reduce the scale of a circuit for sending/receiving radio signals.

Meanwhile, an existing PLL can be used for the clock reproducer 33. The PLL compares the phase of an input clock signal with the phase of an output clock signal, and adjusts the frequency of the output clock signal to reduce the phase difference between these clock signals, thereby generating an output clock signal in phase with the input clock signal. However, the clock signal referred to here represents a signal that periodically rises and falls in the same manner as a continuous wave (CW) and a rectangular wave.

For example, a PLL disclosed in Patent document 2 is known. This PLL comprises a phase comparator for outputting a phase difference signal exclusively in accordance with the emergence timing of a rising edge (positive edge) of a signal and a phase comparator for outputting a phase difference signal exclusively in accordance with the emergence timing of a falling edge (negative edge) of the signal. A signal obtained by adding the phase difference signals respectively output from the two phase comparators is passed through a low pass filter (LPF) to obtain a control voltage for the VCO.

However, the signal input to the clock reproducer 33 according to this embodiment is a modulated signal obtained by the modulation of the first clock signal using the data signal in accordance with the OOK or ASK. As the amplitude of the first clock signal is partly reduced, it is difficult to detect some edges of the first clock signal by this modulated signal. Therefore, when the PLL disclosed in Patent document 2 is used in the clock reproducer 33, the second clock signal is erroneously detected as if its phase is considerably delayed, and the phase noise of the second clock signal might be increased.

Thus, it is desirable for the clock reproducer 33 to use one of the configurations according to several embodiments shown below.

First Embodiment

Figure 9:
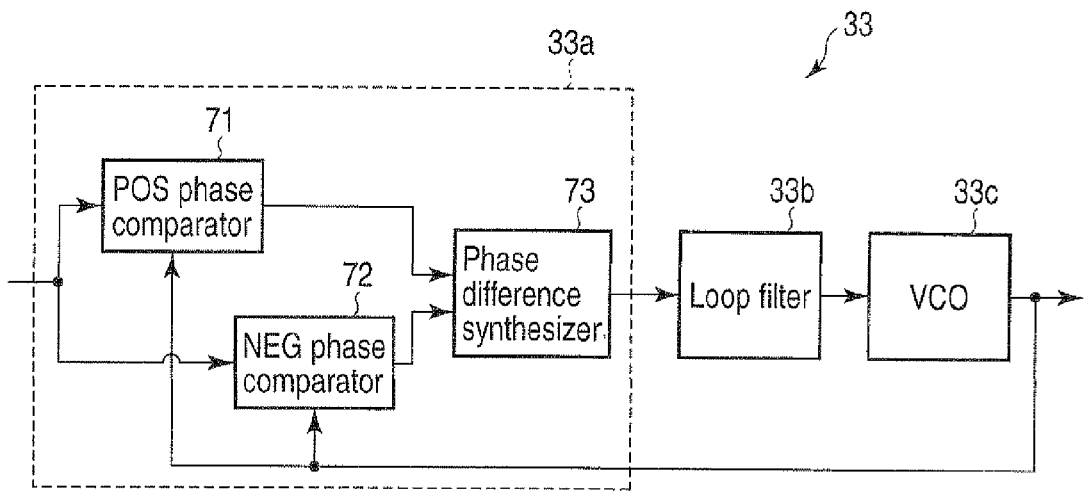
FIG. 9 is a block diagram of the clock reproducer in FIG. 2 according to a first embodiment.

FIG. 9 is a block diagram of the clock reproducer 33 according to a first embodiment. In FIG. 9, the same reference marks are assigned to the same components as those in FIG. 3.

The phase comparator 33a of the clock reproducer 33 according to the first embodiment includes a positive edge phase comparator (POS phase comparator) 71, a negative edge phase comparator (NEG phase comparator) 72 and a phase difference synthesizer 73.

The modulated signal output from the wave detector 32 and the second clock signal output from the VCO 33c are input to the POS phase comparator 71 and the NEG phase comparator 72, respectively.

The POS phase comparator 71 observes the positive edges of the modulated signal and the second clock signal, and outputs a positive phase difference signal corresponding to the phase difference therebetween. Specifically, when the positive edge of the second clock signal is detected before the positive edge of the modulated signal, the POS phase comparator 71 sets the positive phase difference signal to a first level in a period from the positive edge of the second clock signal to the positive edge of the modulated signal. When the positive edge of the modulated signal is detected before the positive edge of the second clock signal, the POS phase comparator 71 sets the positive phase difference signal to a second level in a period from the positive edge of the modulated signal to the positive edge of the second clock signal. In other periods, the POS phase comparator 71 sets the positive phase to a third level.

The NEG phase comparator 72 observes the negative edges of the modulated signal and the second clock signal, and outputs a negative phase difference signal corresponding to the phase difference therebetween. Specifically, when the negative edge of the second clock signal is detected before the negative edge of the modulated signal, the NEG phase comparator 72 sets the negative phase difference signal to a first level in a period from the negative edge of the second clock signal to the negative edge of the modulated signal. When the negative edge of the modulated signal is detected before the negative edge of the second clock signal, the NEC phase comparator 72 sets the negative phase difference signal to a second level in a period from the negative edge of the modulated signal to the negative edge of the second clock signal. In other periods, the NEG phase comparator 72 sets the negative phase to a third level.

Thus, at the first level, the positive phase difference signal and the negative phase difference signal indicate that the phase of the second clock signal is ahead of the phase of the modulated signal. At the second level, the positive phase difference signal and the negative phase difference signal indicate that the phase of the second clock signal is behind the phase of the modulated signal. At the third level, the positive phase difference signal and the negative phase difference signal indicate that no phase difference can be detected. These first to third levels are, for example, voltage values such as +X [V], −X [V] and 0X [V] each represented by a constant value X. Alternatively, the first to third levels may be opposite values −X [V], +X [V] and 0X [V]. Further, the first to third levels may be values that are all equal to or more than 0, such as +X [V], 0X [V] and +X/2 [V]. Still further, the first to third levels may be two-bit values such as 10, 01 and 00 using logical values. In the following case, the first to third levels are +X [V], −X [V] and 0X [V].

When both the positive phase difference signal and the negative phase difference signal are at the third level, the phase difference synthesizer 73 sets the clock phase difference signal to the third level. When one of the positive phase difference signal and the negative phase difference signal is only at the third level, the phase difference synthesizer 73 sets the clock phase difference signal to the sum of the levels of the positive phase difference signal and the negative phase difference signal. That is, when the third level is 0 [V], the phase difference synthesizer 73 finds the exclusive OR of the positive phase difference signal and the negative phase difference signal, and outputs the result as the clock phase difference signal. The clock phase difference signal output by the phase difference synthesizer 73 is provided to the loop filter 33b.

Now, such operation of the clock reproducer 33 according to the first embodiment is described.

Figure 10:
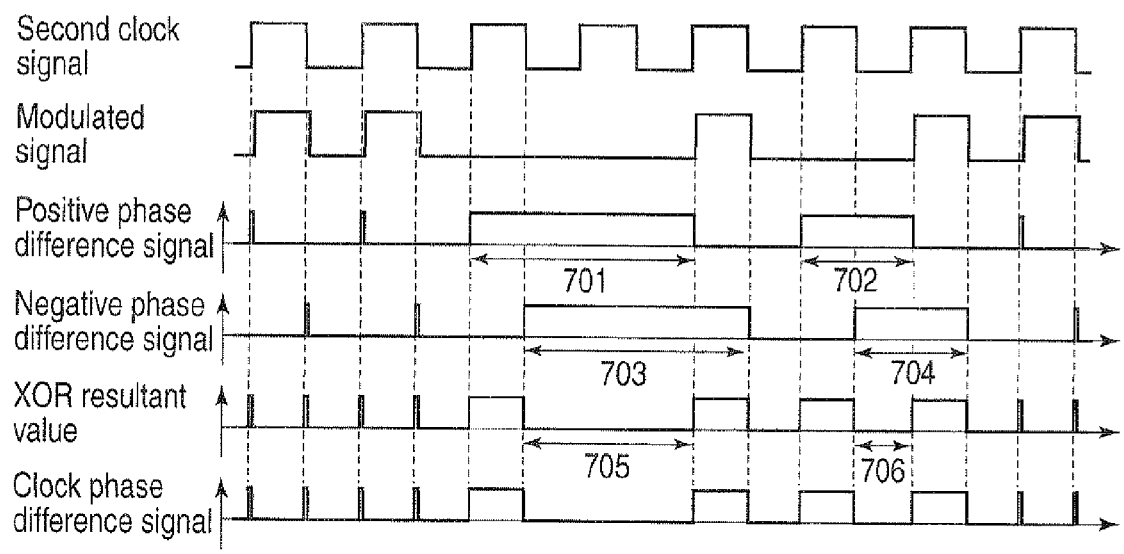
FIG. 10 is a timing chart of one example of the operation of a phase comparator in FIG. 9.

FIG. 10 is a timing chart of one example of the operation of the phase comparator 33a according to the first embodiment.

When the component of the first clock signal only appears in the modulated signal (hereinafter referred to as "no lack"), the timing of the appearance of the first level or second level in the positive edge phase difference signal and the negative phase difference signal is shifted by about half of the period of the second clock signal as shown in FIG. 10. That is, in a situation where the modulated signal and the second clock signal are in phase to some degree, the first level or second level does not simultaneously appear in the positive edge phase difference signal and the negative phase difference signal. On the other hand, when the component of the first clock signal is lacking and an edge to be present in the first clock signal cannot be detected, the first level or second level can be generated over a period equal to or more than one period of the second clock signal, as in periods 701 to 704 in FIG. 10. Further, as shown in a period 705 in which the period 701 and the period 703 overlap and in a period 706 in which the period 702 and the period 704 overlap, the first level or second level simultaneously appears in the positive edge phase difference signal and the negative phase difference signal. Consequently, when the first level or second level simultaneously appears in the positive edge phase difference signal and the negative phase difference signal, there is a strong possibility that the positive edge phase difference signal and the negative phase difference signal are erroneous due to the lack of the first clock signal component. In the periods 705 and 706 in which the first level or second level simultaneously appears in the positive edge phase difference signal and the negative phase difference signal as mentioned above, the exclusive OR of the positive edge phase difference signal and the negative phase difference signal is at the third level. In other periods, the exclusive OR of the positive edge phase difference signal and the negative phase difference signal is the sum of the levels of the positive edge phase difference signal and the negative phase difference signal. A clock phase difference signal having such a level change as shown in, for example, FIG. 10 is then generated.

The clock phase difference signal thus generated in the phase comparator 33a is input to the loop filter 33b where the band of this signal is limited, and the clock phase difference signal is then provided to the VCO 33c as a control voltage.

When the clock phase difference signal is at the first level, the VCO 33c decreases the frequency of the second clock signal. When the clock phase difference signal is at the first level, the phase of the second clock signal is ahead of the phase of the modulated signal, so that the phase difference therebetween is reduced by decreasing the frequency of the second clock signal. When the clock phase difference signal is at the second level, the VCO 33c increases the frequency of the second clock signal. When the clock phase difference signal is at the second level, the phase of the modulated signal is ahead of the phase of the second clock signal, so that the phase difference therebetween is reduced by increasing the frequency the second clock signal. When the clock phase difference signal is at the third level, the VCO 33c does not change the frequency of the second clock signal. Thus, such adjustment of the frequency of the second clock signal is repeated, and the second clock signal is thereby brought in phase with the component of the first clock signal included in the modulated signal.

According to the conventional Pit disclosed in Cited document 2, the clock phase difference signal is kept at the third level even in the periods 705 and 706, and the frequency of the second clock signal is excessively changed accordingly. On the contrary, in the clock reproducer 33 according to the first embodiment, the frequency of the second clock signal is adjusted without respect to phase lags detected by the POS phase comparator 71 and the NEG phase comparator 72 in the periods 705 and 706. Therefore, the phase noise of the second clock signal is reduced as compared with that in the case where the conventional PLL is used.

First Modification of the First Embodiment

Figure 11:
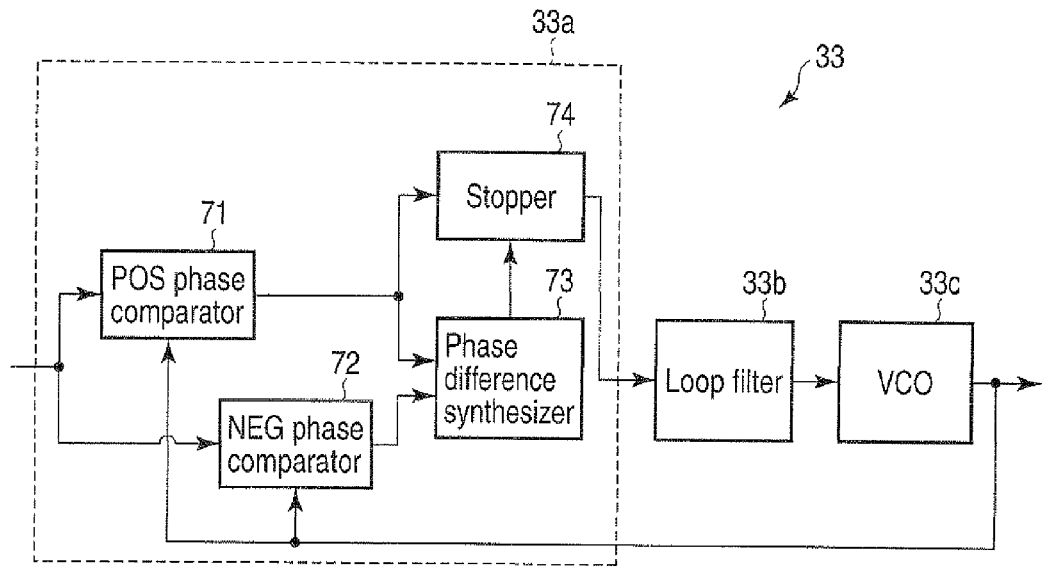
FIG. 11 is a block diagram of the clock reproducer in FIG. 2 according to a first modification of the first embodiment.

FIG. 11 is a block diagram showing the configuration of the clock reproducer 33 according to a first modification of the first embodiment. In FIG. 11, the same components as those in FIG. 3 and FIG. 9 are provided with the same reference marks and are not described in detail.

The phase comparator 33a in the clock reproducer 33 according to this modification includes the POS phase comparator 71, the MEG phase comparator 72, the phase difference synthesizer 73 and a stopper 74.

Figure 12:
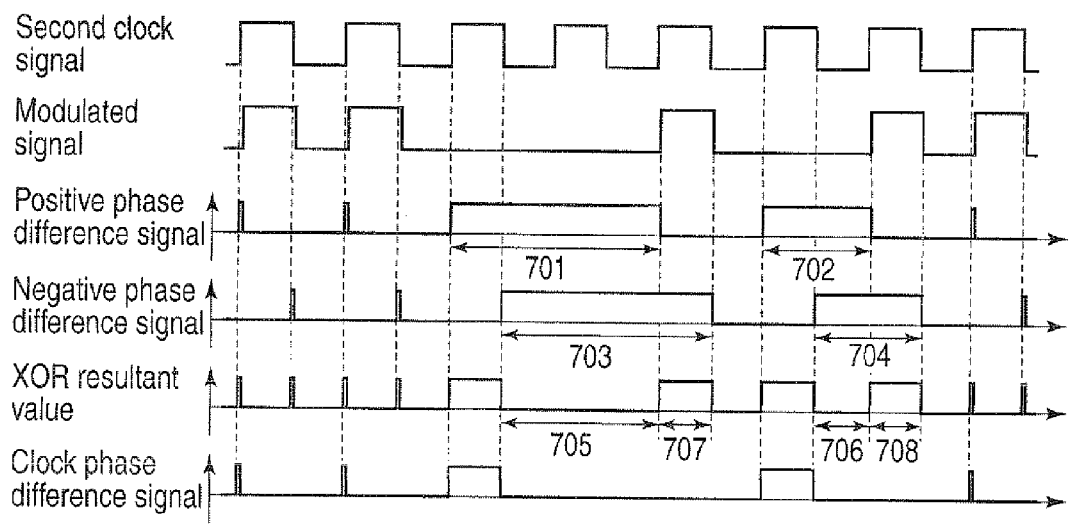
FIG. 12 is a timing chart of one example of the operation of the phase comparator in FIG. 11.

The positive phase difference signal output from the POS phase comparator 71 is input to the stopper 74, and a signal output from the phase difference synthesizer 73 is also input to the stopper 74 as a stop control signal. An output signal of the stopper 74 is then provided to the loop filter 33b as the clock phase difference signal. The stopper 74 outputs the positive phase difference signal as it is in a period in which the stop control signal is at the first level or second level. In other periods, the stopper 74 stops the output of the positive phase difference signal to generate the clock phase difference signal. That is, the stopper 74 generates the clock phase difference signal as a signal shown in FIG. 12 which has the level of the positive phase difference signal in a period when the stop control signal is at the first level or second level and which has the third level in other periods.

In this way, the error of the negative phase difference signal caused in periods 707 and 708 due to the lack of the component of the first clock signal is not reflected in the clock phase difference signal. Therefore, the phase noise of the second clock signal is further reduced. However, the number of detections of the phase difference reflected in the clock phase difference signal is reduced to half of that in the basic configuration according to the first embodiment.

Second Modification of the First Embodiment

Figure 13:
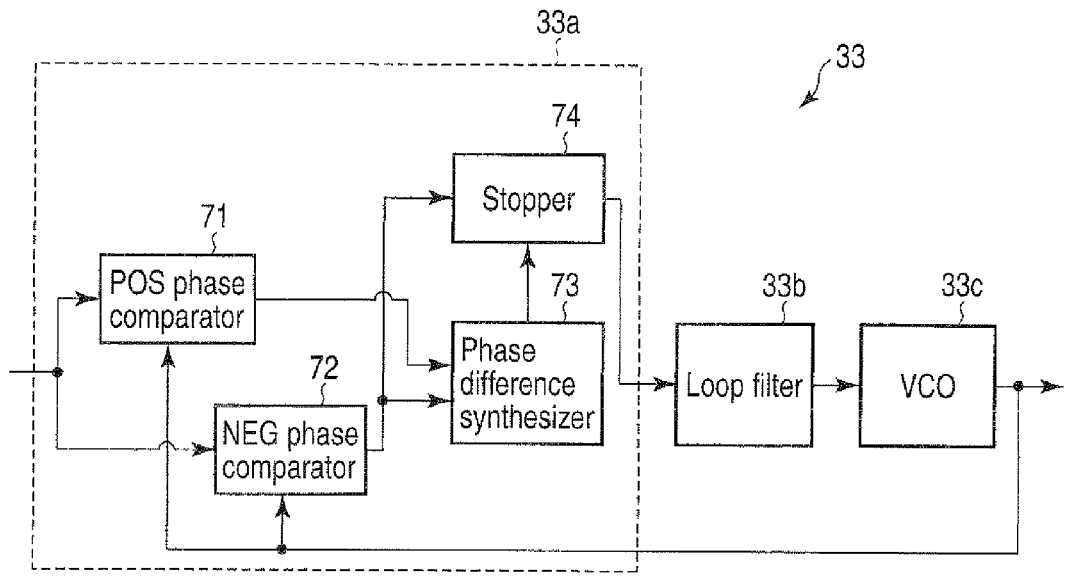
FIG. 13 is a block diagram of the clock reproducer in FIG. 2 according to a second modification of the first embodiment.

FIG. 13 is a block diagram showing the configuration of the clock reproducer 33 according to a second modification of the first embodiment. In FIG. 13, the same components as those in FIG. 3, FIG. 9 and FIG. 11 are provided with the same reference marks and are not described in detail.

The phase comparator 33*a* in the clock reproducer 33 according to this modification includes the POS phase comparator 71, the NEG phase comparator 72, the phase difference synthesizer 73 and the stopper 74.

Figure 14:
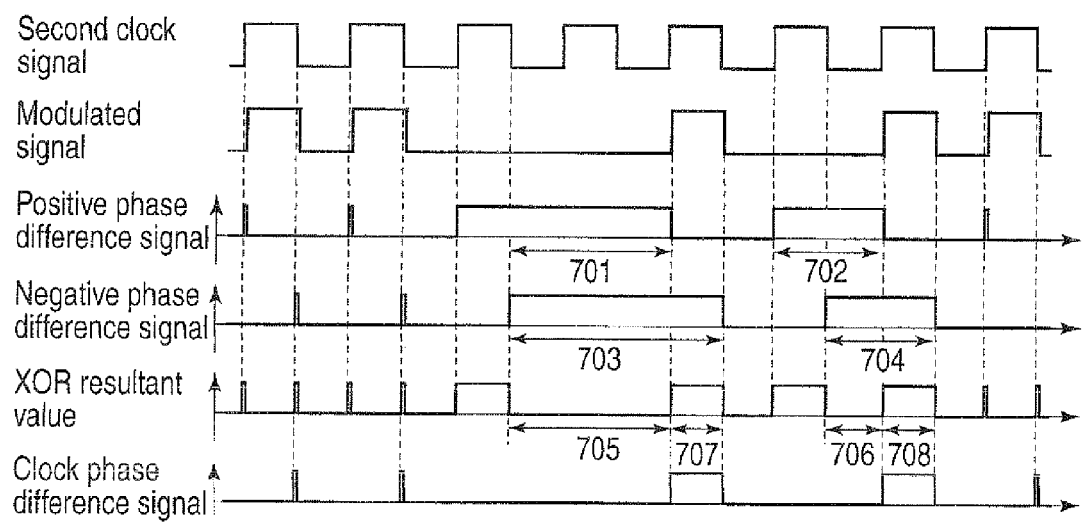
FIG. 14 is a timing chart of one example of the operation of the phase comparator in FIG. 13.

The negative phase difference signal output from the MEG phase comparator 72 is input to the stopper 74, and the signal output from the phase difference synthesizer 73 is also input to the stopper 74 as a stop control signal. An output signal of the stopper 74 is then provided to the loop filter 33*b* as the clock phase difference signal. The stopper 74 outputs the negative phase difference signal as it is in a period in which the stop control signal is at the first level or second level. In other periods, the stopper 74 stops the output of the negative phase difference signal to generate the clock phase difference signal. That is, the stopper 74 generates the clock phase difference signal as a signal shown in FIG. 14 which has the level of the negative phase difference signal in a period when the stop control signal is at the first level or second level and which has the third level in other periods.

In this way, the error of the positive phase difference signal caused in periods 709 and 710 due to the lack of the component of the first clock signal is not reflected in the clock phase difference signal. Therefore, the phase noise of the second clock signal is further reduced. However, the number of detections of the phase difference reflected in the clock phase difference signal is reduced to half of that in the basic configuration according to the first embodiment.

If the clock reproducer 33 according to this embodiment is used in place of the conventional PLL having a phase comparator that only detects a positive edge or negative phase difference, similar performance can be obtained as heretofore by applying the configuration shown in FIG. 11 or FIG. 13 in a period in which there is no lack of the component of the first clock signal. If the clock reproducer 33 according to this embodiment is used in place of the conventional PLL disclosed in Patent document 2, similar performance can be obtained as heretofore by applying the configuration shown in FIG. 9 in a period in which there is no lack of the component of the first clock signal.

Second Embodiment

Figure 15:
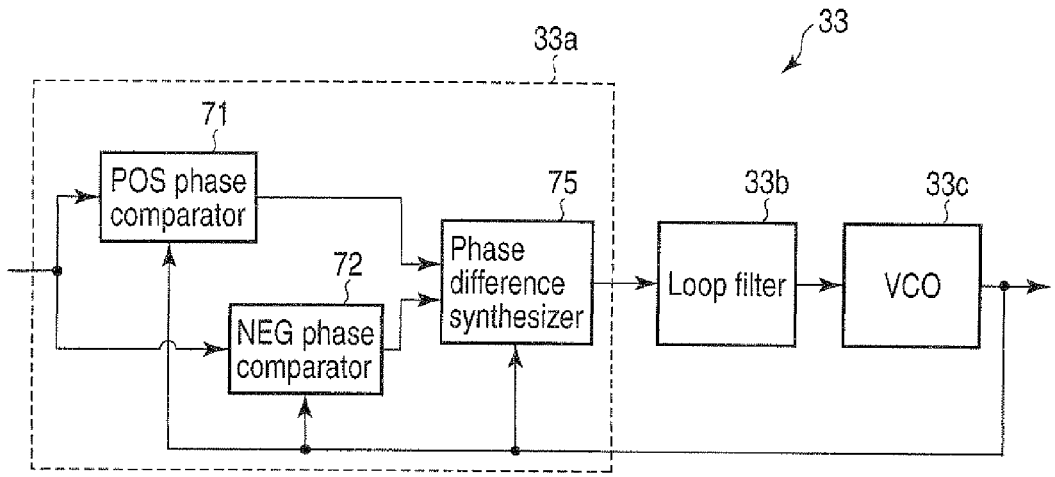
FIG. 15 is a block diagram of the clock reproducer in FIG. 2 according to a second embodiment.

FIG. 15 is a block diagram of the clock reproducer 33 according to a second embodiment. In FIG. 15, the same components as those in FIG. 3 and FIG. 9 are provided with the same reference marks and are not described in detail.

The phase comparator 33*a* in the clock reproducer 33 according to the second embodiment includes the POS phase comparator 71, the NEG phase comparator 72 and a phase difference synthesizer 75. That is, in the second embodiment, the phase difference synthesizer 75 is provided in placed of the phase difference synthesizer 73 according to the first embodiment.

The phase difference synthesizer 75 sets the clock phase difference signal to the third level in an output stop period extending from the point where both the positive phase difference signal and the negative phase difference signal have reached levels other than the third level to a point where a specified time has elapsed. In other periods, the phase difference synthesizer 75 sets the clock phase difference signal to the sum of the levels of the positive phase difference signal and the negative phase difference signal. That is, when the third level is set at 0 [V], the phase difference synthesizer 75 finds an OR resultant value and AND resultant value of the positive phase difference signal and the negative phase difference signal. The phase difference synthesizer 75 basically outputs the OR resultant value as the clock phase difference signal, but sets the clock phase difference signal to the third level exclusively in a period extending from the point where the AND resultant value has reached the first level or second level to a point where a specified time has elapsed. The clock phase difference signal output by the phase difference synthesizer 75 is provided to the loop filter 33*b*.

Now, such operation of the clock reproducer 33 according to the second embodiment is described.

Figure 16:
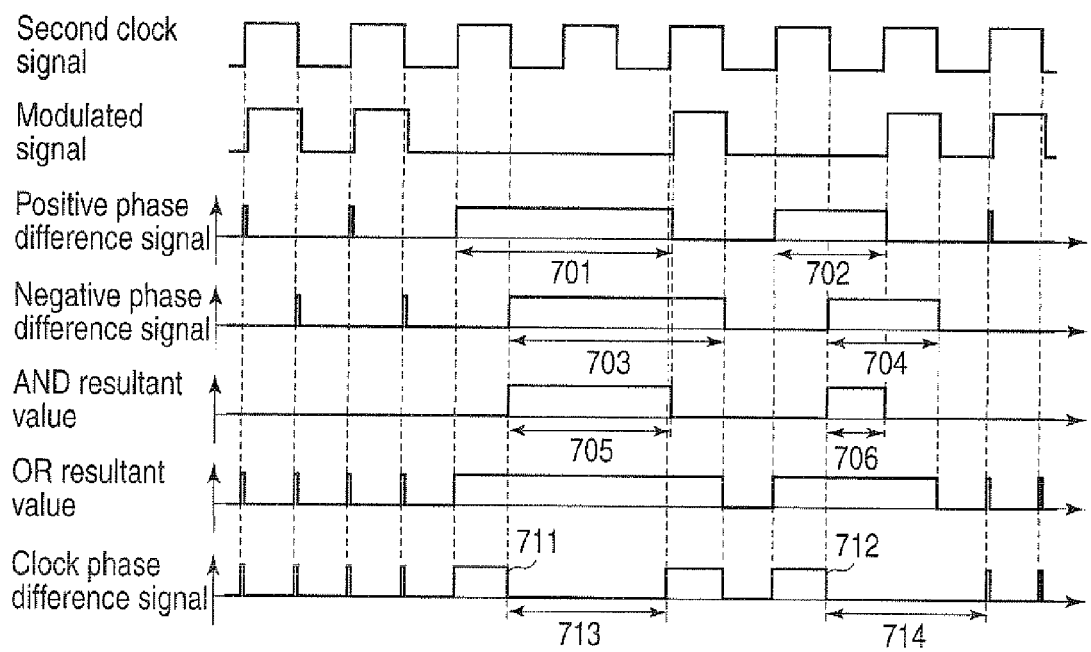
FIG. 16 is a timing chart of one example of the operation of the phase comparator in FIG. 15.

FIG. 16 is a timing chart of one example of the operation of the clock reproducer 33 according to the second embodiment. The example in FIG. 16 concerns a situation similar to that of the example in FIG. 10. The same periods are provided with the same reference marks and are not described in detail.

The AND resultant value is at the first or second level in periods in which the first level or second level simultaneously appears in the positive edge phase difference signal and the negative phase difference signal, as in the period 705 in which the period 701 and the period 703 overlap and in the period 706 in which the period 702 and the period 704 overlap. The third level is set in output stop periods 713 and 714 extending from timings 711 and 712 where the AND resultant value has reached the first or second level as mentioned above to a point where a specified time has elapsed. In other periods, a clock phase difference signal set at the OR resultant value and, for example, shown in FIG. 16 is generated.

For example, a counter driven by use of the second clock signal or modulated signal can be used to measure the specified time for finding the output stop period in the phase difference synthesizer 75. However, the second clock signal is a signal generated by the VCO 33*c* and is unlikely to have a lack. Therefore, the specified time can be more accurately measured by using the second clock signal than by using the modulated signal. However, even if the measurement of the specified time is slightly inaccurate, it is possible to obtain the effect of enabling the reduction of the phase noise of the second clock signal to half of that in the case where the conventional PLL is used. Thus, the specified time may be measured by using the modulated signal. Moreover, both a counter driven by use of the second clock signal and a counter driven by use of the modulated signal may be used to measure an elapsed time, and the output stop period may be judged to be over when one of the counters has first reached the specified time. This makes it possible to more accurately measure a period by using both the second clock signal and the modulated signal when the clock has no lack. Even when the modulated signal has a lack, a measurement can be made with about the same accuracy as that when one counter is only used.

In addition, whether the edge of the modulated signal or the edge of the second clock signal is first generated in a part lacking the component of the first clock is determined by a method of multiplexing the data signal. For example, when the data signal is multiplexed as shown in FIG. 4 to FIG. 6, the signal amplitude is changed so that a period from the rise to fall of the signal is determined as one period. Therefore, the positive edge is first detected in a period in which there is a lack of the component of the first clock.

First Modification of the Second Embodiment

Figure 17:
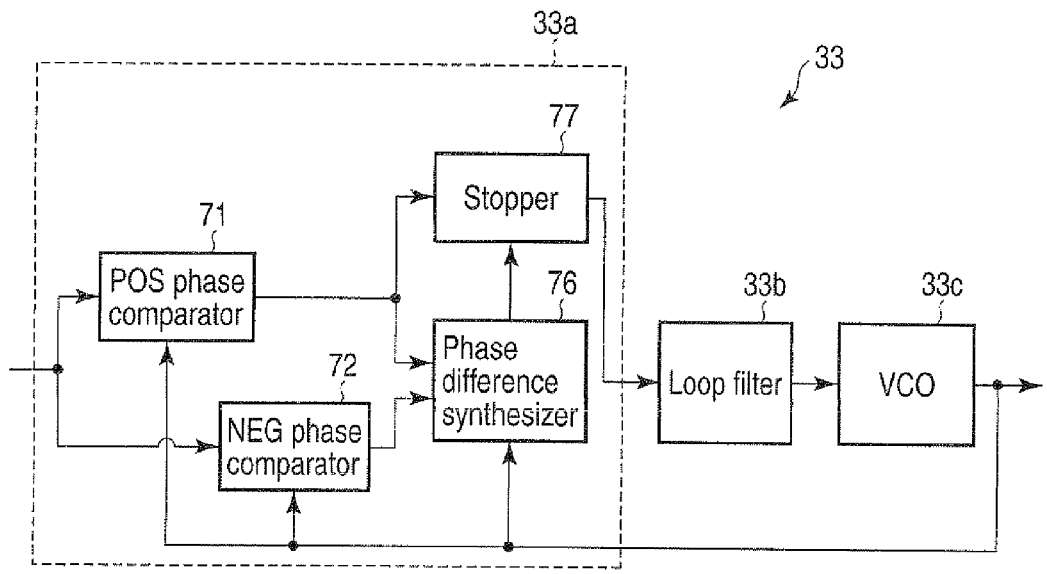
FIG. 17 is a block diagram of the clock reproducer in FIG. 2 according to a first modification of the second embodiment.

FIG. 17 is a block diagram showing the configuration of the clock reproducer 33 according to a first modification of the second embodiment. In FIG. 17, the same components as those in FIG. 3 and FIG. 15 are provided with the same reference marks and are not described in detail.

The phase comparator 33a in the clock reproducer 33 according to this modification includes the POS phase comparator 71, the NEG phase comparator 72, a phase difference synthesizer 76 and a stopper 77.

The phase difference synthesizer 76 generates a stop control signal on the basis of the positive phase difference signal and the negative phase difference signal. Specifically, the phase difference synthesizer 76 finds an AND resultant value of the positive phase difference signal and the negative phase difference signal, and generates the stop control signal as a signal that indicates a stop exclusively in a period extending from the point where the AND resultant value has reached the first level or second level to a point where a specified time has elapsed.

Figure 18:
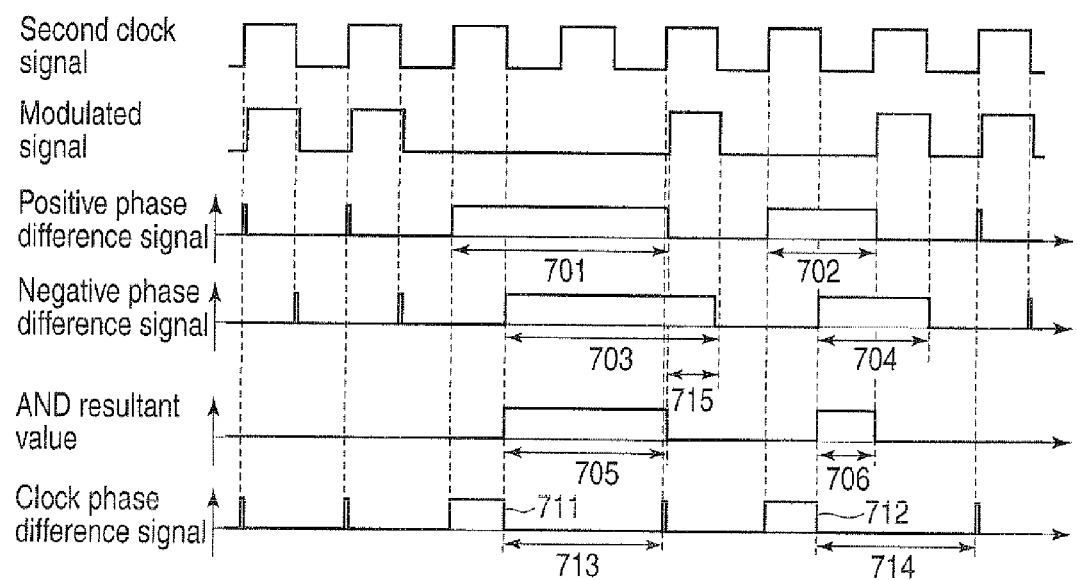
FIG. 18 is a timing chart of one example of the operation of the phase comparator in FIG. 17.

The positive phase difference signal output from the DOS phase comparator 71 is input to the stopper 77, and the stop control signal output from the phase difference synthesizer 76 is also input to the stopper 77. An output signal of the stopper 77 is then provided to the loop filter 33b as the clock phase difference signal. The stopper 77 outputs the positive phase difference signal as it is in a period in which the stop control signal indicates the stop. In other periods, the stopper 77 stops the output of the positive phase difference signal to generate the clock phase difference signal. That is, the stopper 77 generates the clock phase difference signal as a signal shown in FIG. 18 which has the third level in a period when the stop control signal indicates the stop and which has the level of the positive phase difference signal in other periods.

In this way, the error of the negative phase difference signal caused in a period 715 due to the lack of the component of the first clock signal is not reflected in the clock phase difference signal. Therefore, the phase noise of the second clock signal is further reduced. However, the number of detections of the phase difference reflected in the clock phase difference signal is reduced to half of that in the basic configuration according to the second embodiment.

Second Modification of the Second Embodiment

Figure 19:
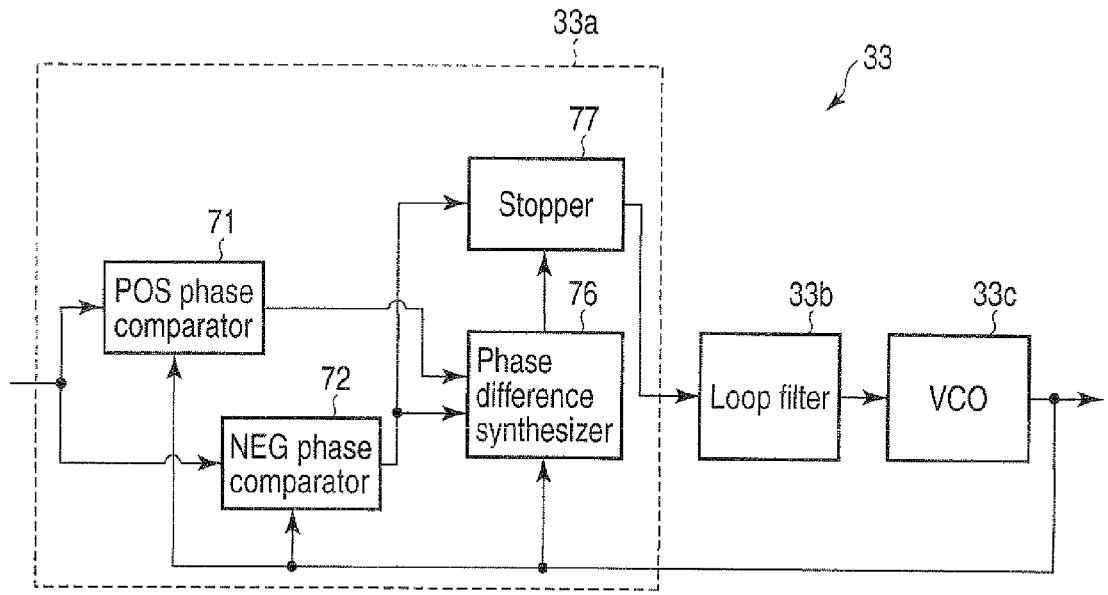
FIG. 19 is a block diagram of the clock reproducer in FIG. 2 according to a second modification of the second embodiment.

FIG. 19 is a block diagram showing the configuration of the clock reproducer 33 according to a second modification of the second embodiment. In FIG. 19, the same components as those in FIG. 3, FIG. 15 and FIG. 17 are provided with the same reference marks and are not described in detail.

The phase comparator 33a in the clock reproducer 33 according to this modification includes the POS phase comparator 71, the NEG phase comparator 72, the phase difference synthesizer 76 and the stopper 77.

Figure 20:
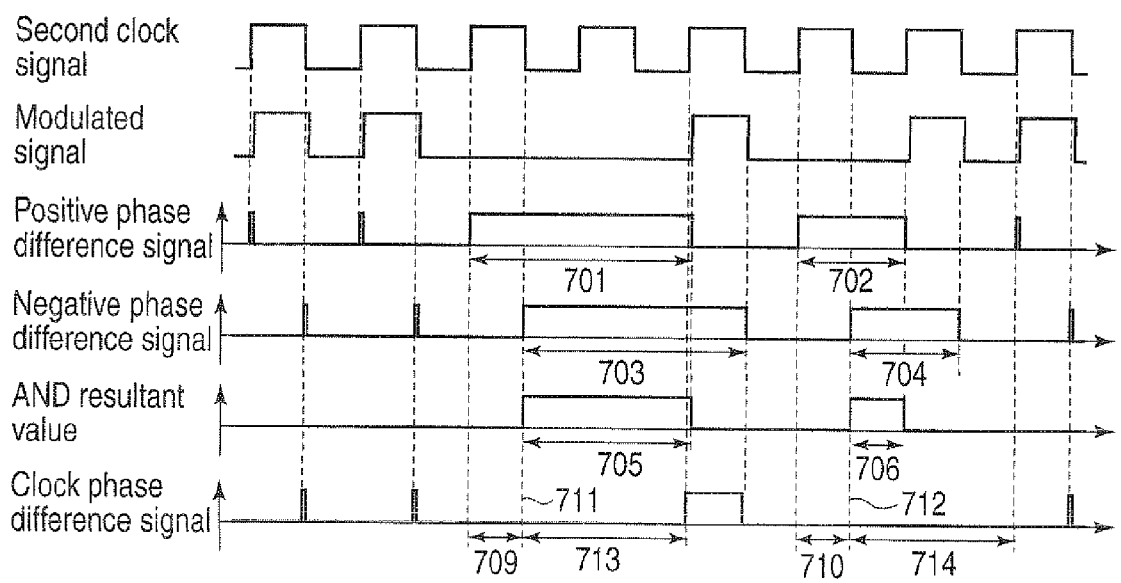
FIG. 20 is a timing chart of one example of the operation of the phase comparator in FIG. 19.

The negative phase difference signal output from the NEG phase comparator 72 is input to the stopper 77, and the stop control signal output from the phase difference synthesizer 76 is also input to the stopper 77. An output signal of the stopper 77 is then provided to the loop filter 33b as the clock phase difference signal. The stopper 77 outputs the negative phase difference signal as it is in a period in which the stop control signal indicates the stop. In other periods, the stopper 77 stops the output of the negative phase difference signal to generate the clock phase difference signal. That is, the stopper 77 generates the clock phase difference signal as a signal shown in FIG. 20 which has the third level in a period when the stop control signal indicates the stop and which has the level of the negative phase difference signal in other periods.

In this way, the error of the positive phase difference signal caused in the periods 709 and 710 due to the lack of the component of the first clock signal is not reflected in the clock phase difference signal. Therefore, the phase noise of the second clock signal is further reduced. However, the number of detections of the phase difference reflected in the clock phase difference signal is reduced to half of that in the basic configuration according to the second embodiment.

If the clock reproducer 33 according to this embodiment is used in place of the conventional PLL having the phase comparator that only detects a positive edge or negative phase difference, similar performance can be obtained as heretofore by applying the configuration shown in FIG. 17 or FIG. 19 in a period in which there is no lack of the component of the first clock signal. If the clock reproducer 33 according to this embodiment is used in place of the conventional PLL disclosed in Patent document 2, similar performance can be obtained as heretofore by applying the configuration shown in FIG. 15 in a period in which there is no lack of the component of the first clock signal.

In the meantime, the output stop period according to the second embodiment is desirably equal to the length of the signal string of the data signal. One reason is that when the output stop period is shorter than the signal string, there is a strong possibility that a lack is produced in the component of the first clock signal after a return from the output stop period. Another reason is that when the output stop period is longer than the signal string, there is a possibility of reduced chances that an effective phase comparison can be made and of an increased time before the PLL is locked. The length of the signal string referred to here indicates a period in which the data signal is multiplexed by the first clock signal as shown in the periods 302, 402 and 502 in FIGS. 4 to 6. However, when the signal string is known in advance, the length of the signal string may be the period in which there is actually a lack of the component of the first clock signal. In the examples of FIGS. 3 to 5, this period corresponds to periods 303, 403 and 503. In this way, the length of the output stop period can be minimized. However, when the length of the signal string is only known but the signal string is not known numerically, or when the period in which there is actually a lack of the component of the first clock signal varies among the data signals, it is desirable to use the periods 302, 402 and 502. This makes it possible to avoid, independently of the value of the signal string, a situation where a lack is produced in the clock after a return from the output stop period. On the other hand, when there is a possibility that a lack is produced in the clock having a period shorter than the length of the signal string due to a cause such as noise other than the multiplexing of the signal string, the stop period may be shorter than the length of the signal string. Thus, even when the output is stopped due to, for example, noise, it is possible to come back from the stop period in a shorter time and effectively perform a phase comparison.

Figure 21:
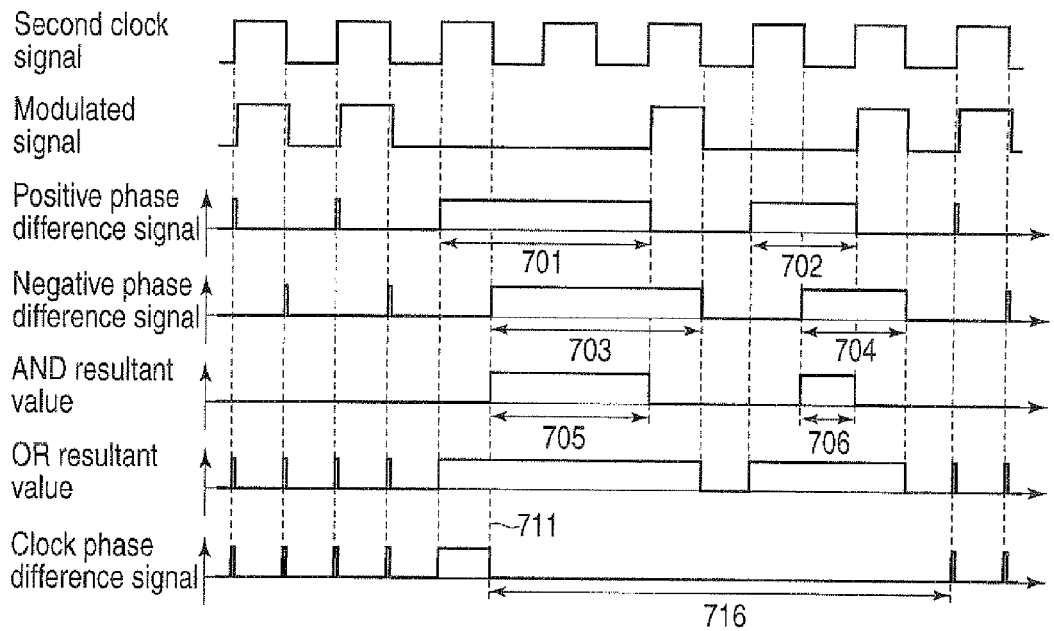
FIG. 21 is a timing chart of a modification of the operation of the phase comparator in FIG. 15.
Figure 22:
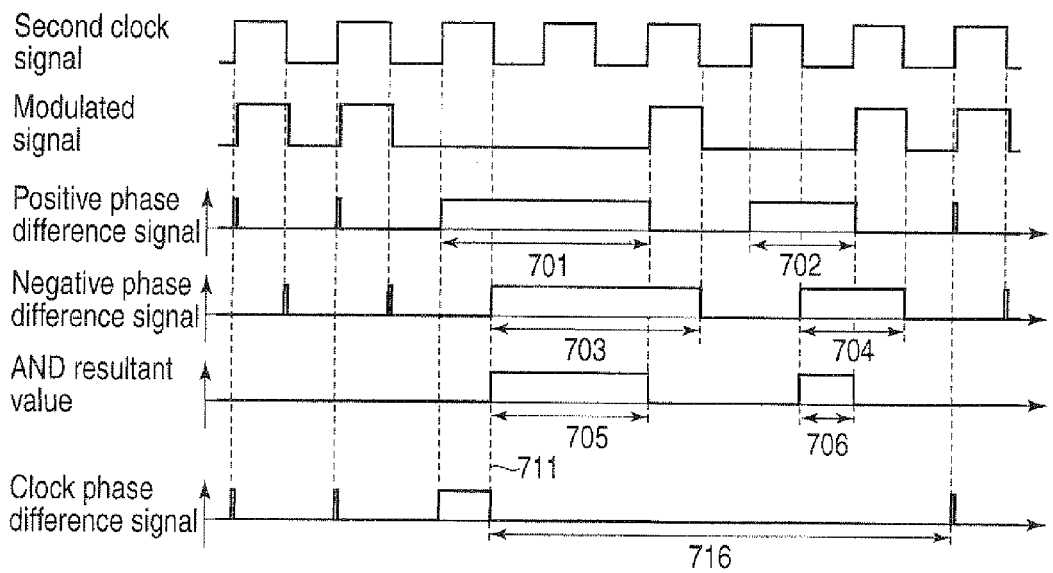
FIG. 22 is a timing chart of a modification of the operation of the phase comparator in FIG. 17.
Figure 23:
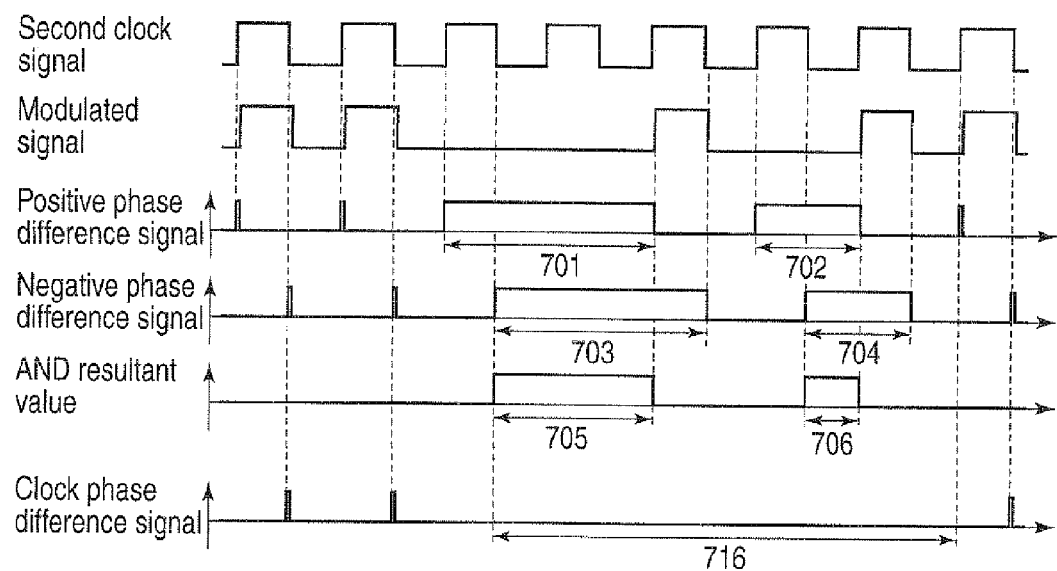
FIG. 23 is a timing chart of a modification of the operation of the phase comparator in FIG. 19.

FIGS. 21 to 23 are timing charts of examples of the operation of the phase comparator 33a when the length of the output stop period is set to be equal to the length of the signal string of the data signal in the configurations shown in FIGS. 15, 17 and 19. In each case, the clock phase difference signal is set at the third level an output stop period 716.

Third Embodiment

Figure 24:
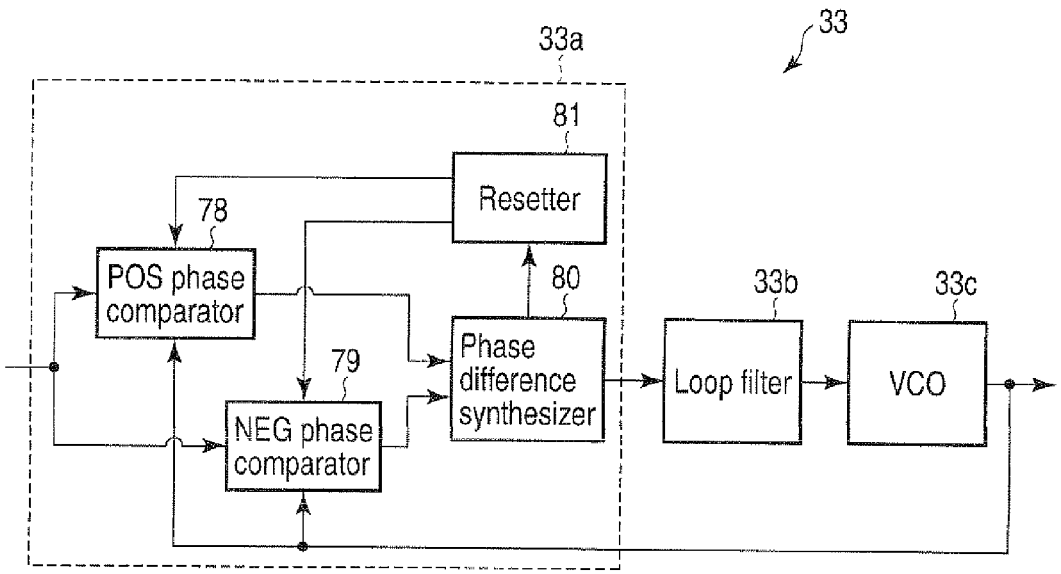
FIG. 24 is a block diagram of the clock reproducer in FIG. 2 according to a third embodiment.

FIG. 24 is a block diagram of the clock reproducer 33 according to a third embodiment. In FIG. 24, the same components as those in FIG. 3 and FIG. 9 are provided with the same reference marks and are not described in detail.

The phase comparator 33a in the clock reproducer 33 according to the third modification includes a positive edge phase comparator (POS phase comparator) 78, a negative edge phase comparator (NEG phase comparator) 79, a phase difference synthesizer 80 and a resetter 81.

Basically, the POS phase comparator 78 and the NEG phase comparator 79 output a positive phase difference signal and a negative phase difference signal similarly to the POS phase comparator 71 and the NEG phase comparator 72. However, the POS phase comparator 78 and the NEG phase comparator 79 have a function of resetting the operating condition to an initial condition under the control of the resetter 81.

The phase difference synthesizer 80 sets the clock phase difference signal to the first or second level when one of the positive phase difference signal and the negative phase difference signal is at the first or second level. The clock phase difference signal output from the phase difference synthesizer 80 is provided to the loop filter 33b. The phase difference synthesizer 80 also outputs a reset signal to the resetter 81 in response to the fact that both the positive phase difference signal and the negative phase difference signal have reached levels other than the third level. That is, in order to set the third level at 0 [V], the phase difference synthesizer 80 finds an OR resultant value of the positive phase difference signal and the negative phase difference signal, and outputs the OR resultant value as the clock phase difference signal. The phase difference synthesizer 80 also finds an AND resultant value of the positive phase difference signal and the negative phase difference signal, and outputs the AND resultant value as the reset signal.

The resetter 81 resets the POS phase comparator 78 and the NEG phase comparator 79 to initial conditions in response to the reset signal provided from the phase difference synthesizer 80. The initial conditions of the POS phase comparator 78 and the NEG phase comparator 79 indicate a condition of resetting the past detection result of one of the edges and waiting for the detection of the previous edge from the modulated signal or the second clock signal. As a result of this resetting, the positive phase difference signal and the negative phase difference signal are also returned to the third level.

Now, such operation of the clock reproducer 33 according to the third embodiment is described.

Figure 25:
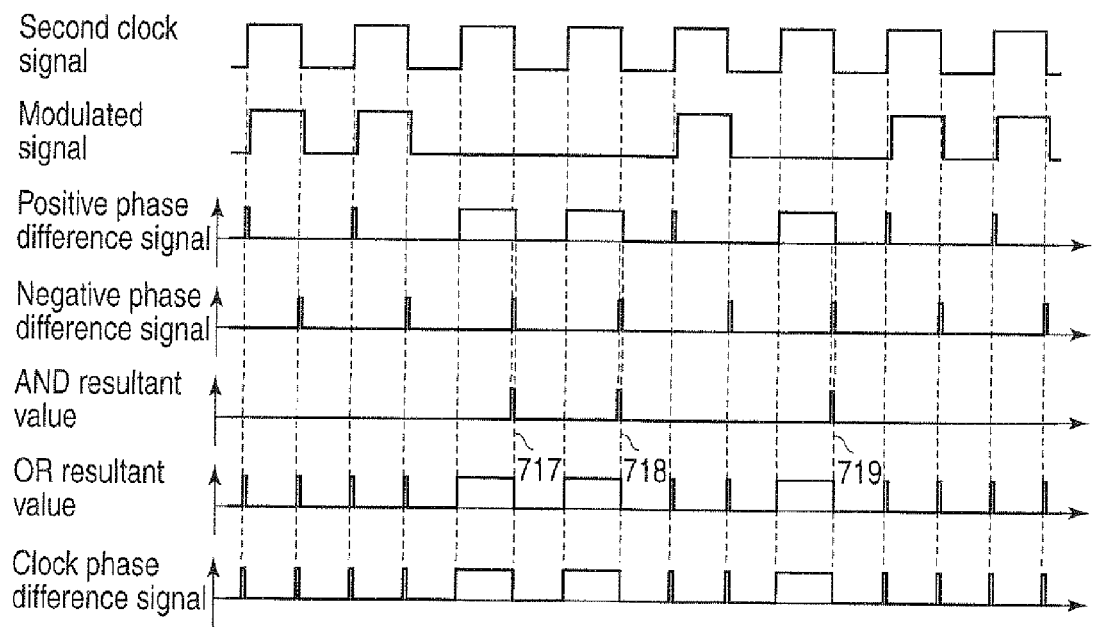
FIG. 25 is a timing chart of one example of the operation of the phase comparator in FIG. 24.

FIG. 25 is a timing chart of one example of the operation of the phase comparator 33a according to the third embodiment. The example in FIG. 25 concerns a situation similar to that of the example in FIG. 10. The same periods are provided with the same reference marks and are not described in detail.

The AND resultant value reaches the first or second level at points 717, 718 and 719 where both the positive phase difference signal and the negative phase difference signal have reached levels other than the third level. The reset signal is provided to the resetter 81 accordingly. As a result, the resetter 81 resets the POS phase comparator 78 and the NEG phase comparator 79 to the initial conditions.

Thus, both the positive phase difference signal and the negative phase difference signal are returned to the third level, so that the condition where both of the signals are at the levels other than the third level is eliminated. As a result, the frequency of the second clock signal is prevented from being continuously adjusted in accordance with the phase difference that is erroneously detected due to the lack of the component of the first clock signal, and the phase noise of the second clock signal is reduced. In particular, according to the third embodiment, resetting is performed whenever the levels other than the third level simultaneously appear in the positive base difference signal and the negative phase difference signal. It is therefore possible to effectively reduce an erroneously output phase difference when there are sporadic lacks of the component of the first clock signal.

In addition, both the positive phase difference signal and the negative phase difference signal may be input to the resetter 81, and an AND resultant value may be calculated by the resetter 81.

First Modification of the Third Embodiment

Figure 26:
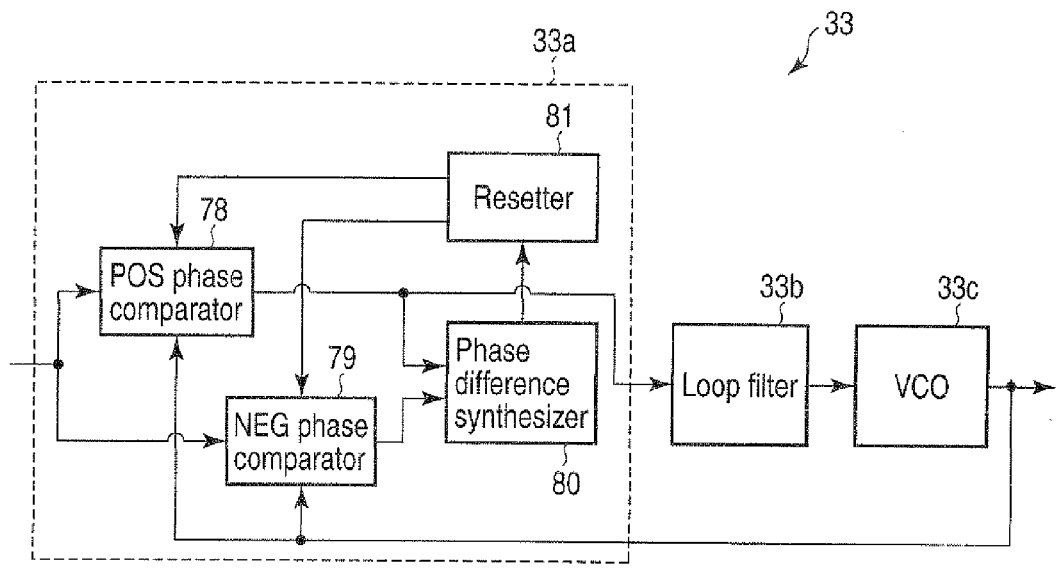
FIG. 26 is a block diagram of the clock reproducer in FIG. 2 according to a first modification of the third embodiment.

FIG. 26 is a block diagram showing the configuration of the clock reproducer 33 according to a first modification of the third embodiment. In FIG. 26, the same components as those in FIG. 3 and FIG. 24 are provided with the same reference marks and are not described in detail.

The phase comparator 33a in the clock reproducer 33 according to this modification provides the positive phase difference signal, as it is, to the loop filter 33b as the clock phase difference signal.

Figure 27:
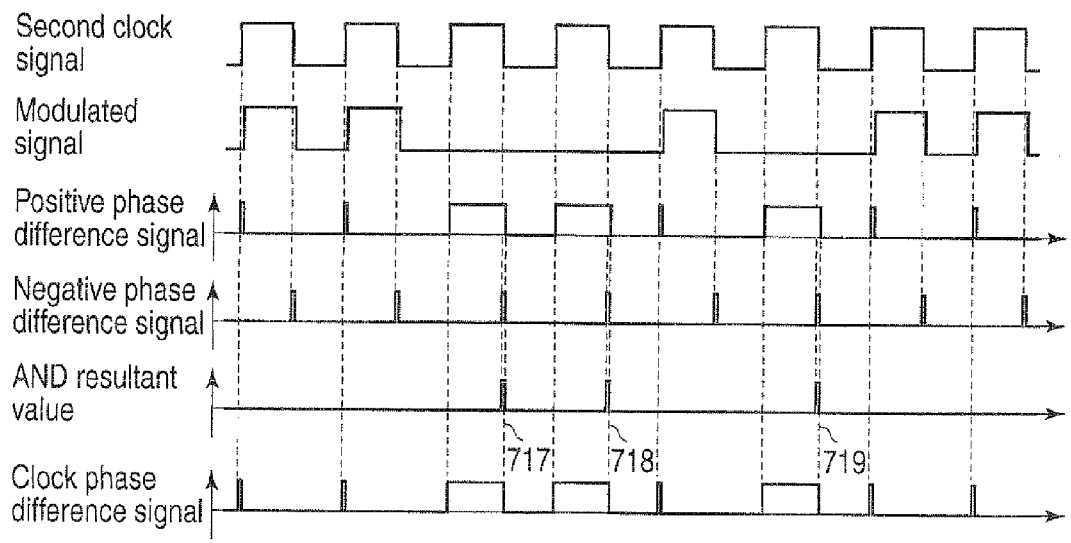
FIG. 27 is a timing chart of one example of the operation of the phase comparator in FIG. 26.

FIG. 27 is a timing chart of one example of the operation of the phase comparator 33a according to the first modification of the third embodiment.

Second Modification of the Third Embodiment

Figure 28:
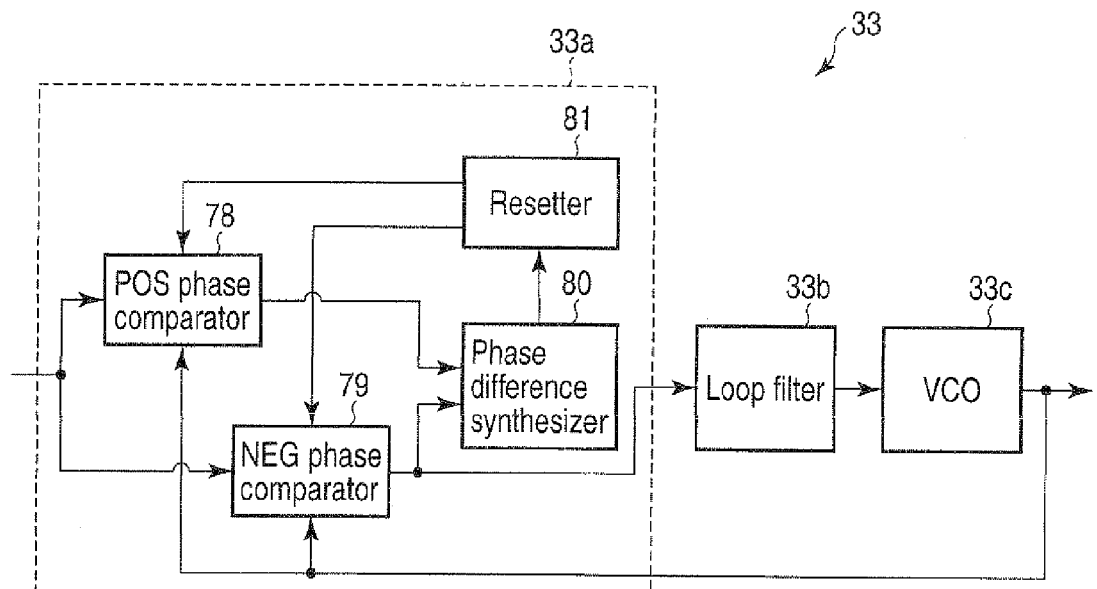
FIG. 28 is a block diagram of the clock reproducer in FIG. 2 according to a second modification of the third embodiment.

FIG. 28 is a block diagram showing the configuration of the clock reproducer 33 according to a second modification of the third embodiment. In FIG. 28, the same components as those in FIG. 3 and FIG. 24 are provided with the same reference marks and are not described in detail.

The phase comparator 33a in the clock reproducer 33 according to this modification provides the negative phase difference signal, as it is, to the loop filter 33b as the clock phase difference signal.

Figure 29:
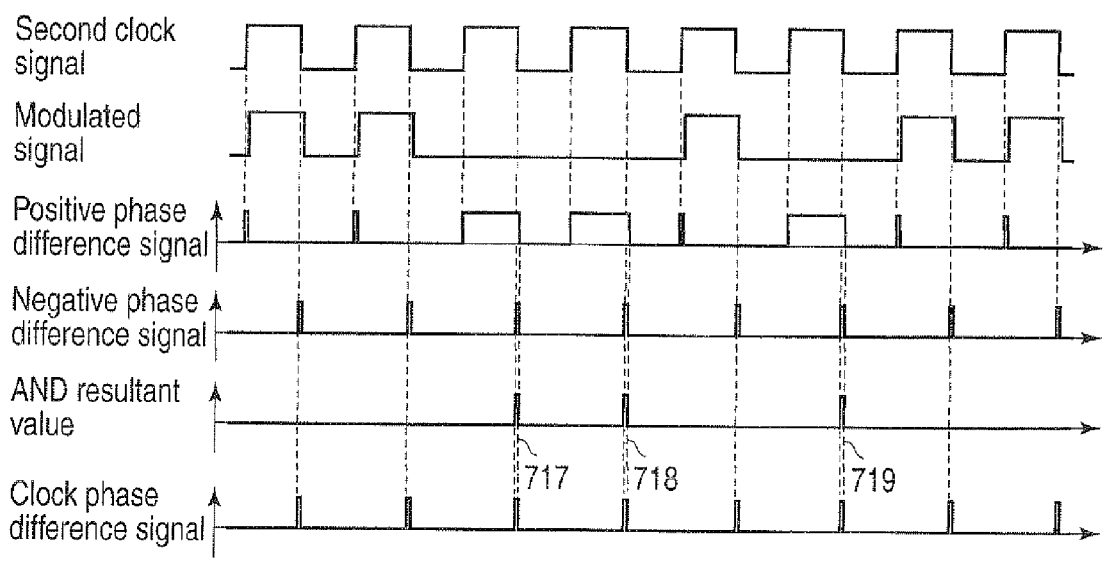
FIG. 29 is a timing chart of one example of the operation of the phase comparator in FIG. 28.

FIG. 29 is a timing chart of one example of the operation of the phase comparator 33a according to the second modification of the third embodiment.

Various modifications of this embodiment can be made as follows.

Third Modification of the Third Embodiment

Figure 30:
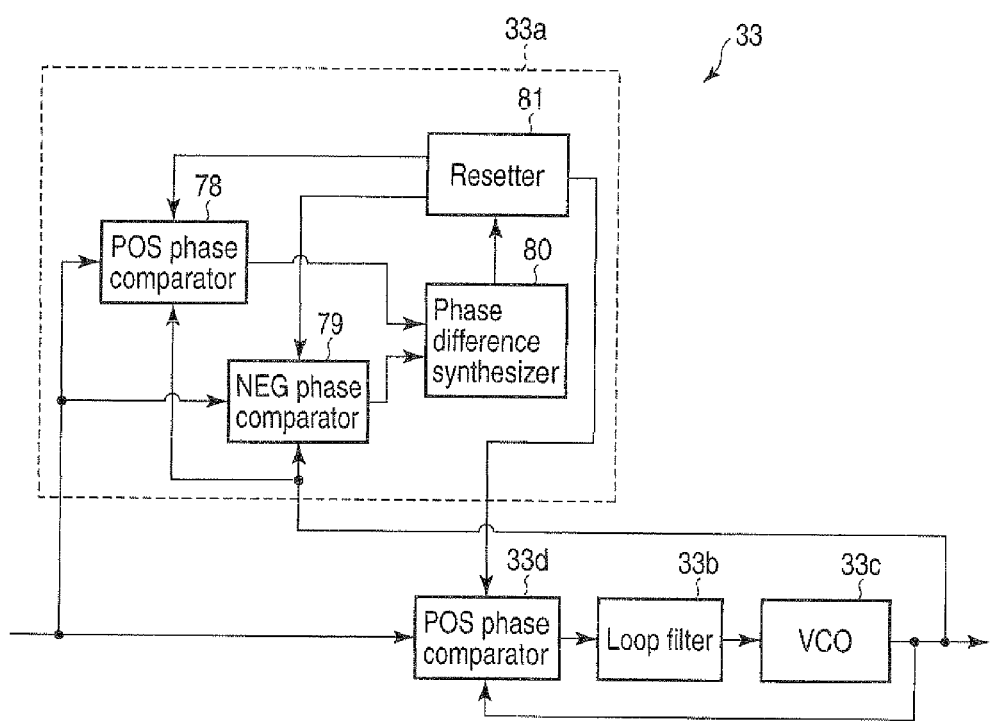
FIG. 30 is a block diagram of the clock reproducer in FIG. 2 according to a third modification of the third embodiment.

FIG. 30 is a block diagram of the clock reproducer 33 according to a third modification of the third embodiment. In FIG. 30, the same components as those in FIG. 3 and FIG. 24 are provided with the same reference marks and are not described in detail.

The clock reproducer 33 according to this modification includes the phase comparator 33a, the loop filter 33b, the VCO 33c and a positive edge phase comparator (POS phase comparator) 33d. The phase comparator 33a includes the POS phase comparator 78, the NEC phase comparator 79, the phase difference synthesizer 80 and the resetter 81.

The modulated signal is provided not only to the phase comparator 33a but also to the POS phase comparator 33d. The POS phase comparator 33d generates a positive phase difference signal similarly to the SOS phase comparator 78. The positive phase difference signal generated by this POS phase comparator 33d is provided to the loop filter 33b as the clock phase difference signal. The POS phase comparator 33d further has a function of resetting the operating condition to an initial condition under the control of the resetter 81.

Thus, according to this modification, a second clock signal similar to that in the second modification of the third embodiment is generated. Moreover, according to this modification, a known PLL circuit is configured by the loop filter 33b, the VCO 33c and the POS phase comparator 33d. Therefore, this modification can be easily made by adding the phase comparator 33a to such an existing PLL circuit.

Fourth Modification of the Third Embodiment

Figure 31:
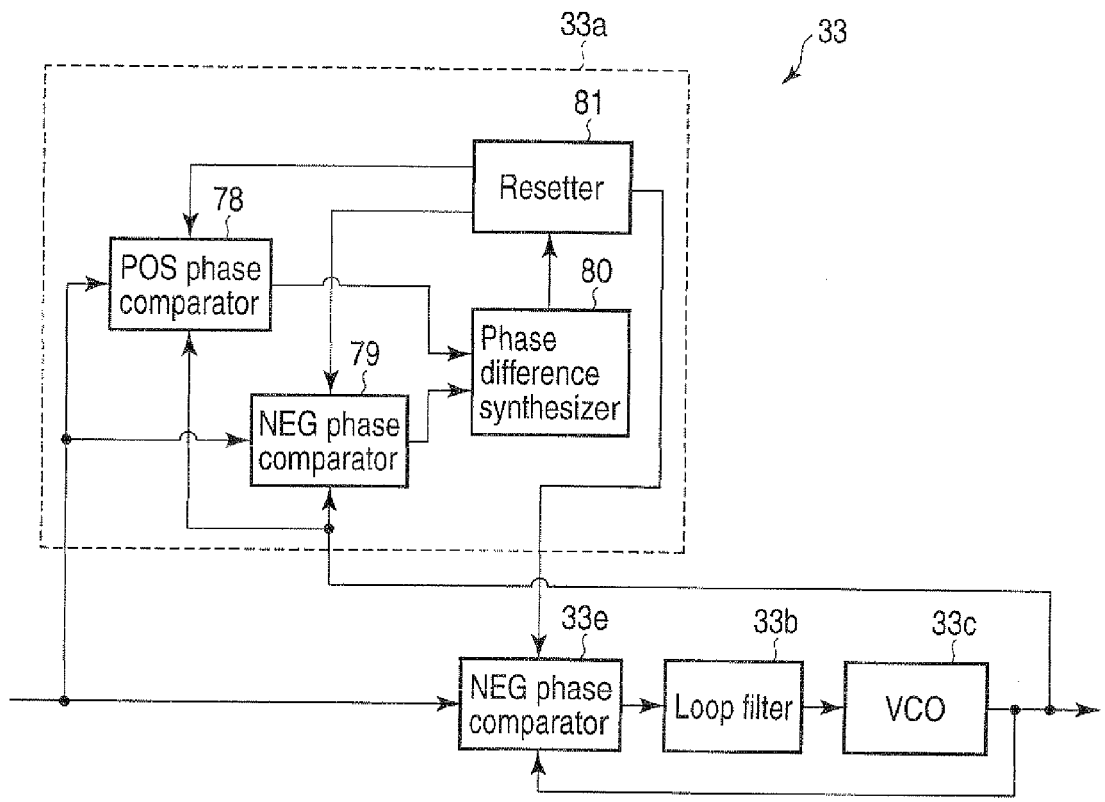
FIG. 31 is a block diagram of the clock reproducer in FIG. 2 according to a fourth modification of the third embodiment.

FIG. 31 is a block diagram of the clock reproducer 33 according to a fourth modification of the third embodiment. In FIG. 31, the same components as those in FIG. 3 and FIG. 24 are provided with the same reference marks and are not described in detail.

The clock reproducer 33 according to this modification includes the phase comparator 33a, the loop filter 33b, the VCO 33c and a negative edge phase comparator (NEG phase comparator) 33e. The phase comparator 33a, includes the POS phase comparator 78, the NEG phase comparator 79, the phase difference synthesizer 80 and the resetter 81.

The modulated signal is provided not only to the phase comparator 33a but also to the NEG phase comparator 33e. The NEG phase comparator 33e generates a negative phase difference signal similarly to the NEG phase comparator 79. The negative phase difference signal generated by this NEG phase comparator 33e is provided to the loop filter 33b as the clock phase difference signal. The NEG phase comparator 33e further has a function of resetting the operating condition to an initial condition under the control of the resetter 81.

Thus, according to this modification, a second clock signal similar to that in the third modification of the third embodiment is generated. Moreover, according to this modification, a known PLL circuit is configured by the loop filter 33b, the VCO 33c and the NEG phase comparator 33e. Therefore, this modification can be easily made by adding the phase comparator 33a to such an existing PLL circuit.

Figure 32:
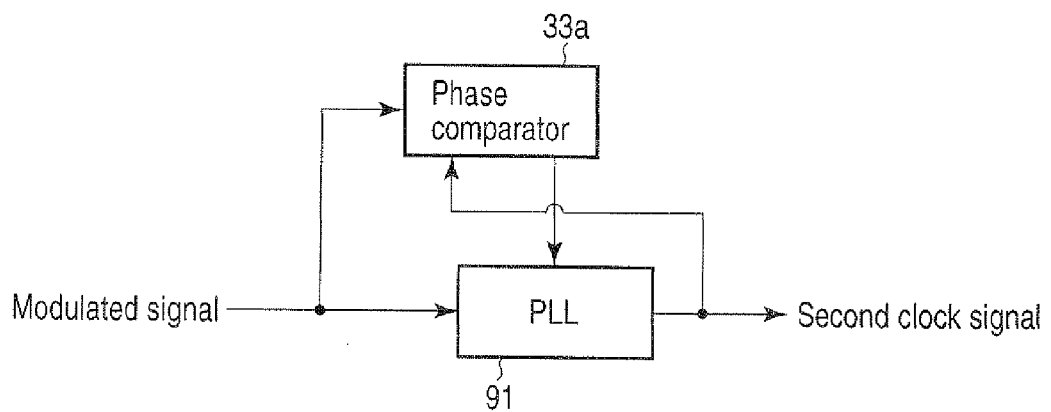
FIG. 32 is a diagram showing a concept of achieving the third and fourth modifications of the third embodiment by connecting the phase comparator to an existing PLL.

FIG. 32 is a diagram showing a concept of achieving the third and fourth modifications of the third embodiment by connecting the phase comparator 33a to an existing PLL 91.

The coil unit 6b may also be used for RF transmission. In this case, an operating condition for receiving the magnetic resonance signal and an operating condition for the RF transmission can be controlled from the main controller 24 by the data signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit the inventions.

What is claimed is:

1. A magnetic resonance imaging apparatus comprising a control unit, and an RF coil unit separate from the control unit,
    the control unit comprising:
        a clock generator which generates a first clock signal,
        a data generator which generates a data signal in order to indicate an operating condition of the RF coil unit,
        a modulator which modulates the first clock signal by the data signal in order to obtain a modulated signal,
        a transmission signal generator which generates a clock transmission signal including the modulated signal, and
        a transmitting antenna which emits the clock transmission signal to space, the RF coil unit comprising:
        a receiving antenna which converts the clock transmission signal propagated through the space into an electric signal,
        a wave detector which detects the modulated signal from the clock transmission signal converted into the electric signal by the receiving antenna,
        a clock reproducer which generates a second clock signal synchronous with the first clock signal from the modulated signal detected by the wave detector,
        an RF coil which detects a magnetic resonance signal generated in a subject,
        a digital convertor which digitizes, synchronously with the second clock signal, the magnetic resonance signal detected by the RF coil,
        a data detector which detects the data signal as distinct from the detected modulated signal by making use of the second clock signal, and
        a controller which controls the operating condition of the RF coil unit to be set at the operating condition that is indicated by the distinct data signal detected by the data detector.

2. The magnetic resonance imaging apparatus according to claim 1, wherein the RF coil unit comprises
    a plurality of RF coils, and
    a coil selector which validates one RF coil, of the plurality of RF coils in order to detect the magnetic resonance signal,
    the data generator generates the data signal in order to indicate the RF coil to be validated among the plurality of RF coils, and
    the controller controls the RF coil selector in order to validate the RF coil indicated by the data signal.

3. The magnetic resonance imaging apparatus according to claim 1, wherein the RF coil unit includes, as the operating condition, a transmission mode in order to emit a high-frequency pulse which excites a spin in the subject from the RF coil, and a receiving mode in order to detect the magnetic resonance signal by the RF coil,
    the data generator generates the data signal in order to indicate one of the transmission mode and the receiving mode, and
    the controller switches the operating condition into the mode indicated by the data signal.

4. The magnetic resonance imaging apparatus according to claim 1, wherein the RF coil unit comprises:
    a plurality of RF coils, and
    a switching unit which selectively forms a coupling mode in order to couple at least two of the plurality of RF coils and a decoupling mode to decouple the RF coils,
    the data generator generates the data signal in order to indicate one of either the coupling mode and the decoupling mode, and the controller controls the switching unit in order to form the mode indicated by the data signal.

5. The magnetic resonance imaging apparatus according to claim 4, wherein the switching unit uses a PIN diode in order to switch between the coupling mode and decoupling mode.

6. The magnetic resonance imaging apparatus according to claim 1, wherein the RF coil unit further comprises:
   an adding unit which adds a start signal indicating the start of an echo signal onto the magnetic resonance signal detected by the RF coil or onto the magnetic resonance signal after the magnetic resonance signal is digitized by the digital convertor,
   the data generator generates the data signal in order to indicate a timing of adding the start signal, and
   the controller controls the adding unit in order to add the start signal in accordance with the timing indicated by the data signal.

7. The magnetic resonance imaging apparatus according to claim 1, further comprising:
   a high-frequency transmitter which transmits a high-frequency pulse in order to excite a spin in the subject,
   wherein the RF coil unit further comprises:
      a resonance signal transmitter which generates a resonance signal transmission signal, including the magnetic resonance signal, after the magnetic resonance signal is digitized by the digital convertor, and
      a transmitting antenna which emits the generated resonance signal transmission signal to space,
   the data generator generates the data signal, in order to indicate a transmission stop and a transmission start, in accordance with a timing of the transmission of the high-frequency pulse by the high-frequency transmitter, and
   the controller controls the resonance signal transmitter in order to stop the supply of the resonance signal transmission signal at the transmitting antenna, in accordance with the indication of the transmission stop, and in order to start the supply of the resonance signal transmission signal at the transmitting antenna in accordance with the indication of the transmission start.

8. The magnetic resonance imaging apparatus according to claim 1, wherein the clock reproducer comprises:
   an oscillator which oscillates the second clock signal and which is changeable in oscillation frequency in accordance with a control signal that is inputted to the oscillator,
   a phase comparator which compares the phase of the modulated signal detected by the wave detector with the phase of the second clock signal oscillated by the oscillator in order to output a clock phase difference signal, and
   a loop filter which increases the oscillation frequency in response to the fact that the clock phase difference signal is at a first level, decreases the oscillation frequency in response to the fact that the clock phase difference signal is at a second level, and generates the control signal in order to prevent the change of the oscillation frequency in response to the fact that the clock phase difference signal is at a third level, and
   the phase comparator further comprises:
      a positive edge phase comparator which outputs a positive phase difference signal, the positive edge phase comparator setting the positive phase difference signal to a first level in a period from a positive edge of the modulated signal to a positive edge of the second clock signal when the positive edge of the modulated signal is detected before the positive edge of the second clock signal, the positive edge phase comparator setting the positive phase difference signal to a second level in a period from the positive edge of the second clock signal to the positive edge of the modulated signal when the positive edge of the second clock signal is detected before the positive edge of the modulated signal, the positive edge phase comparator setting the positive phase difference signal to a third level in other periods,
      a negative edge phase comparator which outputs a negative phase difference signal, the negative edge phase comparator setting the negative phase difference signal to a first level in a period from a negative edge of the modulated signal to a negative edge of the second clock signal when the negative edge of the modulated signal is detected before the negative edge of the second clock signal, the negative edge phase comparator setting the negative phase difference signal to a second level in a period from the negative edge of the second clock signal to the negative edge of the modulated signal when the negative edge of the second clock signal is detected before the negative edge of the modulated signal, the negative edge phase comparator setting the negative phase difference signal to a third level in other periods, and
      a phase difference synthesizer which outputs the clock phase difference signal, the phase difference synthesizer setting the clock phase difference signal to a third level when both the positive phase difference signal and the negative phase difference signal are at the third level and occur in a specified period starting from a point where both the positive phase difference signal and the negative phase difference signal are not at the third level, the phase difference synthesizer, also setting the clock phase difference signal to a level which is a combination of the levels of the positive phase difference signal and the negative phase difference signal, when one of the positive phase difference signal and the negative phase difference signal is only occurring at the third level.

9. The magnetic resonance imaging apparatus according to claim 8, wherein the specified period is a period in which both the positive phase difference signal and the negative phase difference signal are not occurring at the third level.

10. The magnetic resonance imaging apparatus according to claim 8, wherein the specified period is a period from a point where both the positive phase difference signal and the negative phase difference signal are not at the third level upto a point where a specified time has elapsed.

11. The magnetic resonance imaging apparatus according to claim 10, wherein the specified time is a time, before a number of counts of the positive edges, or a number of counts of the negative edges, of the modulated signal, or of the second clock signal, reaches a specified number.

12. The magnetic resonance imaging apparatus according to claim 10, wherein the data generator generates the data signal at a constant string length, and
   the phase difference synthesizer designates, as the specified time, a time corresponding to the constant string length.

13. The magnetic resonance imaging apparatus according to claim 8, wherein the specified period is a period from a point where both the positive phase difference signal and the negative phase difference signal are not at the third level upto a point where only one of the positive phase difference or negative phase difference signals is set at the third level next.

14. The magnetic resonance imaging apparatus according to claim 8, wherein the phase difference synthesizer sets the clock phase difference signal at a level in which the levels of the positive phase difference signal and the negative phase difference signal are added together, only when one of the positive phase difference signal and the negative phase difference signal is at the third level.

15. The magnetic resonance imaging apparatus according to claim 8, wherein the phase difference synthesizer sets the clock phase difference signal at the level of the positive phase difference signal, only when one of the positive phase difference signal and the negative phase difference signal is at the third level.

16. The magnetic resonance imaging apparatus according to claim 8, wherein the phase difference synthesizer sets the clock phase difference signal at the level of the negative phase difference signal, only when one of the positive phase difference signal and the negative phase difference signal is at the third level.

17. A phase comparator that is compatible with a magnetic resonance imaging apparatus, which outputs a clock phase difference signal representing a phase difference between a modulated first clock signal and a second clock signal, the modulated signal being obtained by modulating a first clock signal by making use of a data signal, the phase comparator comprising:
a positive edge phase comparator which outputs a positive phase difference signal, the positive edge phase comparator setting the positive phase difference signal to a first level in a period from a positive edge of the modulated signal to a positive edge of the second clock signal when the positive edge of the first clock signal is detected before the positive edge of the second clock signal, the positive edge phase comparator setting the positive phase difference signal to a second level in a period from the positive edge of the second clock signal to the positive edge of the modulated signal when the positive edge of the second clock signal is detected before the positive edge of the modulated signal, the positive edge phase comparator setting the positive phase difference signal to a third level in other periods,
a negative edge phase comparator which outputs a negative phase difference signal, the negative edge phase comparator setting the negative phase difference signal to a first level in a period from a negative edge of the modulated signal to a negative edge of the second clock signal when the negative edge of the modulated signal is detected before the negative edge of the second clock signal, the negative edge phase comparator setting the negative phase difference signal to a second level in a period from the negative edge of the second clock signal to the negative edge of the modulated signal when the negative edge of the second clock signal is detected before the negative edge of the modulated signal, the negative edge phase comparator setting the negative phase difference signal to a third level in other periods, and
a phase difference synthesizer which outputs the clock phase difference signal, the phase difference synthesizer setting the clock phase difference signal to a third level when both the positive phase difference signal and the negative phase difference signal are at the third level and occur in a specified period starting from a point where both the positive phase difference signal and the negative phase difference signal are not at the third level, the phase difference synthesizer, also setting the clock phase difference signal to a level which is a combination of the levels of the positive phase difference signal and the negative phase difference signal, when only one of the positive phase difference signal and the negative phase difference signal is occurring at the third level.

18. The phase comparator according to claim 17, wherein the specified period is a period in which both the positive phase difference signal and the negative phase difference signal are not occurring at the third level.

19. The phase comparator according to claim 17, wherein the specified period is a period from a point where both the positive phase difference signal and the negative phase difference signal are not occurring at the third level to a point where a specified time has elapsed.

20. The phase comparator according to claim 19, wherein the specified time, is a time, before the number of counts of the positive edges or the number of counts of negative edges, of either the modulated signal, or the second clock signal, reaches a specified number.

21. The phase comparator according to claim 19, wherein the specified time, is a time corresponding to a string length, of the data signal.

22. The phase comparator according to claim 17, wherein the specified period is a period from a point where both the positive phase difference signal and the negative phase difference signal are not occurring at the third level, to a next point where only one of either the positive phase difference signal or the negative phase difference signal is set in order to occur at the third level.

23. The phase comparator according to claim 17, wherein the phase difference synthesizer sets the clock phase difference signal at a level in which the levels of the positive phase difference signal and the negative phase difference signal are added together, when only one of the positive phase difference signal and the negative phase difference signal is occurring at the third level.

24. The phase comparator according to claim 17, wherein the phase difference synthesizer sets the clock phase difference signal at the level of the positive phase difference signal, when only one of the positive phase difference signal and the negative phase difference signal is occurring at the third level.

25. The phase comparator according to claim 17, wherein the phase difference synthesizer sets the clock phase difference signal at the level of the negative phase difference signal, when only one of the positive phase difference signal and the negative phase difference signal is occurring at the third level.

26. An RF coil unit configured for use in a magnetic resonance imaging apparatus together with a separate control unit functioning in order to emit a clock transmission signal including a modulated signal into space, the modulated signal being obtained by modulating a first clock signal by use of a distinct data signal indicating an operating condition of the RF coil unit, the RF coil unit comprising:
a receiving antenna which converts the clock transmission signal propagated through the space into an electric signal,
a wave detector which detects the modulated signal from the clock transmission signal converted into the electric signal by the receiving antenna,
a clock reproducer which generates a second clock signal synchronous with the first clock signal from the modulated signal detected by the wave detector,
an RF coil which detects a magnetic resonance signal generated in a subject,
a digital convertor which digitizes, synchronously with the second clock signal, the magnetic resonance signal detected by the RF coil,
a data detector which detects the data signal as distinct from the detected modulated signal by making use of the second clock signal, and a controller which controls the operating condition of the RF coil unit to be set at the operating condition that is indicated by the distinct data signal detected by the data detector.

* * * * *